US007078154B2

(12) United States Patent
Endo et al.

(10) Patent No.: US 7,078,154 B2

(45) **Date of Patent: *Jul. 18, 2006**

(54) PRESENSITIZED PLATE

(75) Inventors: Tadashi Endo, Shizuoka (JP); Takeshi Serikawa, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 315 days.

This patent is subject to a terminal disclaimer.

(21) Appl. No.: 10/188,984

(22) Filed: Jul. 5, 2002

(65) Prior Publication Data

US 2003/0165775 A1 Sep. 4, 2003

(30) Foreign Application Priority Data

| | | | |
|---|---|---|---|
| Jul. 6, 2001 | (JP) | ............................ | 2001-206011 |
| Jul. 27, 2001 | (JP) | ............................ | 2001-227818 |
| Sep. 6, 2001 | (JP) | ............................ | 2001-270355 |

(51) Int. Cl.
*G03F 7/095* (2006.01)
*G03F 7/09* (2006.01)

(52) U.S. Cl. .................................... 430/278.1; 101/459

(58) Field of Classification Search ............ 430/278.1; 101/459

See application file for complete search history.

(56) References Cited

U.S. PATENT DOCUMENTS

| | | | | |
|---|---|---|---|---|
| 4,976,198 | A | 12/1990 | Ohba et al. | |
| 5,074,976 | A | 12/1991 | Uesugi et al. | |
| 5,395,489 | A | 3/1995 | Ward et al. | |
| 5,449,441 | A | 9/1995 | Amor et al. | |
| 5,731,123 | A * | 3/1998 | Kawamura et al. | 430/176 |
| 6,103,087 | A | 8/2000 | Mori | |
| 6,716,567 | B1 * | 4/2004 | Endo et al. | 430/278.1 |
| 2003/0145748 | A1 * | 8/2003 | Endo et al. | 101/458 |
| 2003/0165768 | A1 * | 9/2003 | Hotta et al. | 430/302 |

FOREIGN PATENT DOCUMENTS

| | | | |
|---|---|---|---|
| EP | 0 141 254 | A1 | 5/1985 |
| EP | 0 730 979 | A2 | 9/1996 |
| EP | 0 812 705 | A1 | 12/1997 |
| EP | 0 816 118 | A1 | 1/1998 |
| EP | 0 887 203 | A1 | 12/1998 |
| EP | 1 063 103 | A2 | 12/2000 |
| EP | 1 138 519 | A2 | 10/2001 |
| EP | 1 142 708 | A1 | 10/2001 |
| EP | 1 231 510 | A2 | 8/2002 |
| EP | 1 270 258 | A1 | 1/2003 |
| GB | 2 281 128 | A | 2/1995 |
| JP | 11-167204 | A | 6/1999 |
| WO | WO 02/34544 | A1 * | 5/2002 |

OTHER PUBLICATIONS

Google search "novorac" one page, Sep. 2003.*
Altavista search "novorac", one page, Sep. 2003.*
East Database, Search results for "novorac" in USPAT, PREPUB files, 3 pages run Sep. 11, 2004 by Exmr. Hamilton.*

* cited by examiner

*Primary Examiner*—Cynthia Hamilton
(74) *Attorney, Agent, or Firm*—Sughrue Mion, PLLC

(57) ABSTRACT

A presensitized plate having: on an aluminum support, a thermosensitive layer containing a photothermal conversion agent which absorbs infrared rays and generates heat and a water-insoluble and alkali-soluble resin, of which solubility to an alkali aqueous solution increases by heating, wherein the aluminum support has a grained structure with large undulation and a grained structure with small undulation on a surface thereof. This presensitized plate is excellent in damage resistance and sensitivity, and after the plate is processed into a lithographic plate, it is also excellent in scum resistance and press life.

5 Claims, 3 Drawing Sheets

PRESENSITIZED PLATE

BACKGROUND OF THE INVENTION

1. Field of the Invention

The present invention relates to a presensitized plate, more particularly to a positive working presensitized plate having a thermosensitive layer, of which solubility to an alkali aqueous solution increases (namely, becomes alkali-soluble) by heating due to photothermal conversion by a laser beam or the like, which is excellent in both a quality that is less likely to scratch (damage resistance) and sensitivity (development performance), excellent in both a quality less likeliness to get dirty (scum resistance) and press life at printing. In addition, the present invention relates to a positive working sensitized plate having a thermosensitive layer containing a novolac resin, which is excellent in press life after burning-in processing.

2. Description of the Related Arts

With development of image formation technology in recent years, it has come to be possible to perform direct plate making by scanning narrow focused laser beams on the printing plate to form a manuscript of letters, images and the like directly on the plate without using a film manuscript.

In a presensitized plate of a so-called thermal positive working type for causing photothermal conversion in a recording layer (thermosensitive layer) by laser beam irradiation to make the recording layer alkali soluble, and thus forming a positive image, a subtle change in interaction of binder molecules contained in the recording layer by laser beam exposure is utilized as an image forming principle. Accordingly, a difference in ON/OFF levels of alkaline solubility between exposed and unexposed portions is reduced. Therefore, for the purpose of obtaining clear discrimination to be put to practical use, use has been made of means for forming a recording layer structure by providing a surface slightly soluble layer in developer as an uppermost layer of the recording layer, and suppressing developer solubility of the unexposed portion.

However, when the surface slightly soluble layer is damaged for some reason, even a portion intended as an image area is made easily soluble in the developer. In other words, a printing plate produced is damaged very easily from a practical standpoint. Thus, scratch-shaped non-image portion is brought about by subtle contacts such as clashing in handling of the printing plate, subtle rubbing of an interleaving sheet, contact of fingers with the plate surface or the like. Accordingly, handling of the printing plate is very difficult in printing plate work under the present circumstance. In order to improve the damage resistance as described above, efforts have been made by providing a layer made of a fluorochemical surfactant or a wax agent on a surface of a recording layer so as to decrease coefficient of friction. However, these countermeasures have not sufficiently overcome the problem.

Meanwhile, a study has also been made for improving development performance in order to increase the discrimination. For this purpose, an attempt is made to provide a hydrophilic layer prepared by performing silicate treatment or an alkali soluble undercoat (layer becoming soluble in alkali) between recording layer and support. In accordance with these methods, though fairly high development performance is ensured and a development latitude at a practical level is obtained, adhesion between the recording layer and the support is decreased. In addition, when the profile of the support surface is made flat so as to remove deep concave portions on the support surface that causes residential layer for scum resistance improvement, press life thereof decreases so greatly that the presensitized plate becomes practically unusable. Therefore, a presensitized plate with a satisfactory performance in terms of ease in printing, that is, excellent in press life and also in scum resistance, has not been realized.

Meanwhile, in order to prepare the surface slightly soluble layer as described above, a typical method is to cause the thermosensitive layer to contain an acrylic resin with a novolac resin. However, a presensitized plate with a thermosensitive layer containing many acrylic resins is difficult to harden even performing after-heat processing (hereafter, referred to as a "burning-in processing") after development, and thus press life thereof is not greatly improved.

Meanwhile, a thermosensitive layer mainly composed of novolac resins is cited as a thermosensitive layer of which press life is greatly improved by burning-in processing. However, such a presensitized plate with a thermosensitive layer mainly composed of novolac resins has not sufficiently formed a surface slightly soluble layer. Accordingly, when a sensitivity of the thermosensitive layer is designed such that an exposed area is developed, a developer is likely to be permeated also into an unexposed area. As a result, adhesion between the thermosensitive layer or an intermediate layer such as the undercoat layer (hereafter referred to as "thermosensitive layer or the like") and the support decreases, thereby decreasing press life thereof. Namely, it was difficult to achieve both development performance and press life thereof.

Particularly, when an area with sharp grains of a support surface where an ink is likely to remain is reduced in order to improve scum resistance at the time of printing, the thermosensitive layer or the like is also unlikely to spread. Further, when the thermosensitive layer is hardened by burning-in processing, the thus hardened thermosensitive layer does not spread on the support. Therefore, substantially no effect of improving press life due to burning-in processing can be obtained. Namely, it is difficult to achieve both scum resistance and press life after burning-in processing.

SUMMARY OF THE INVENTION

It is therefore an object of the present invention to provide a positive working presensitized plate having a thermosensitive layer which becomes alkali-soluble due to photothermal conversion by a laser beam, which is excellent in both damage resistance and sensitivity, and also is excellent in both scum resistance at printing and press life.

It is a second object of the present invention to provide a positive working presensitized plate with a thermosensitive layer which becomes alkali-soluble due to photothermal conversion by a laser beam, which is excellent in both press life and development performance, and also is excellent in scum resistance at the time of printing and press life after burning-in processing.

The inventors devoted themselves to researches to accomplish the aforementioned objects, and the research contents will be explained in detail.

As described above, a thermal positive working presensitized plate is provided with a hydrophilic layer or an alkali-soluble layer on the interface between the thermosensitive layer and the support in order to secure a practical range of development latitude range. Therefore, if a profile of the support surface is made flat in order to improve scum resistance, press life is greatly decreased.

In this case, press life largely depends on the adhesion between the thermosensitive layer and the support, and the adhesion changes almost in proportion to a contact area between the thermosensitive layer and the support. Therefore, press life can be improved by increasing a surface area of the support larger so as to increase a contact area between the thermosensitive layer and the support.

Meanwhile, scum resistance is improved when a mist of ink is difficult to be kept in non-image areas of the printing plate during printing. In order to accomplish this, the inventors thought that a sharp portion of the support surface should become smaller.

The inventors quantified a profile of the sharp portion and found that scum resistance corresponds to an area ratio (steepness degree a45) of a portion in the support where an angle of inclination is 45° or more. Paying attention to this property value, the inventors discovered, as profiles that achieve both scum resistance and press life, a double structure comprising a grained structure with large undulation and a grained structure with small undulation, and a triple structure comprising a grained structure with large undulation, a grained structure with medium undulation, and a grained structure with small undulation. The inventors thus have completed the present invention.

In addition, the inventors found that, by specifying crystal grain diameter and alloy component of aluminum in an aluminum plate used in an aluminum support of which surface has the aforementioned grain profile, graining property can be made homogeneous and scum resistance and press life can be further improved.

In a thermal positive working presensitized plate with a thermosensitive layer mainly composed of novolac resins, though press life is greatly improved by burning-in processing, it is difficult to prevent a developer from permeating into the interface between the thermosensitive layer or the like and the support at the time of development, as above described. As a result of permeation of the developer, a chemical interaction at the interface between the thermosensitive layers or the like and the support is weakened.

The inventors found that, in a case where an aluminum support of which surface has the aforementioned grain profile, effect of improving press life due to burning-in processing can be obtained if, novolac resins consist of a specified amount of the water-insoluble and alkali-soluble resins contained in the thermosensitive layer.

The inventors further found that combination of the aforementioned support and the aforementioned thermosensitive layer allows all of development performance, press life, and scum resistance to become excellent, and greatly improves press life after burning-in processing.

That is, the aforementioned purposes are accomplished by the following present invention of (1) to (13).

(1) A presensitized plate comprising: on an aluminum support, a thermosensitive layer containing a photothermal conversion agent which absorbs infrared rays and generates heat and a water-insoluble and alkali-soluble resin, of which solubility to an alkali aqueous solution increases by heating, wherein the aluminum support has a grained structure with large undulation and a grained structure with small undulation on a surface thereof.

(2) A presensitized plate comprising, on an aluminum support, a thermosensitive layer containing a photothermal conversion agent which absorbs infrared rays and generates heat and a water-insoluble and alkali-soluble resin, of which solubility to an alkali aqueous solution increases by heating, wherein the aluminum support has a grained structure with large undulation, a grained structure with medium undulation, and a grained structure with small undulation on a surface thereof.

(3) The presensitized plate according to the (1) or (2), wherein a mean wavelength of the grained structure with small undulation is 0.01 to 0.6 μm.

(4) The presensitized plate according to any one of the (1) to (3), wherein a mean wavelength of the grained structure with large undulation is 0.5 to 30 μm, and a mean wavelength of the grained structure with small undulation is 0.01 to 0.3 μm.

(5) The presensitized plate according to any one of the (1) to (4), wherein an aluminum plate used in the aluminum support is made of aluminum material JIS A1050, and mean crystal grain diameters of the aluminum are 2 to 200 μm in a minor axis and 50 to 1500 pm in a major axis.

(6) The presensitized plate according to any one of the (1) to (5), wherein an aluminum plate used in the aluminum support contains 0.02 to 0.1 wt % of Si, 0.005 wt % or less of Cu, and 0.1 to 0.5 wt % of Fe.

(7) The presensitized plate according to any one of the (1) to (6), wherein the thermosensitive layer is a superimposed thermosensitive layer having two or more layers.

(8) The presensitized plate according to one of the (1) to (7), wherein 50 wt % or more of the water-insoluble and alkali-soluble resin is a novolac resin.

(9) The presensitized plate according to any one of the (1) to (8), wherein the aluminum support is obtained by providing the aluminum plate with two or more types of treatment selected by a group consisting of mechanical graining treatment, electrochemical graining treatment by an electrolyte containing a nitric acid, electrochemical graining treatment by an electrolyte containing a hydrochloric acid, and chemical dissolving treatment by an alkali aqueous solution.

(10) The presensitized plate according to the (9), wherein the aluminum support is obtained by providing the aluminum plate with mechanical graining treatment, alkali-etching treatment, desmutting treatment by an acid, electrochemical graining treatment by an electrolyte containing a nitric acid, and electrochemical graining treatment by an aqueous solution containing hydrochloric acid, in this order.

(11) The presensitized plate according to the (9), wherein the aluminum support is obtained by providing the aluminum plate with alkali etching treatment, desmutting treatment by an acid, and electrochemical graining treatment by an aqueous solution containing a hydrochloric acid, in this order.

(12) The presensitized plate according to the (9), wherein the aluminum support is obtained by providing the aluminum plate with the electrochemical graining treatment (the last electrochemical graining treatment, when providing with multiple electrochemical graining treatments) and subsequently the chemical dissolving treatment by an alkali aqueous solution with a dissolved amount of aluminum of 0.5 $g/m^2$ or less.

(13) The presensitized plate according to any one of the (1) to (12), to be developed by a developer containing substantially no alkali metal silicates.

A presensitized plate according to the present invention is excellent in damage resistance and sensitivity, and after the plate is processed into a lithographic plate, it is also excellent in scum resistance and press life.

Particularly, a presensitized plate according to the present invention in which 50 wt % or more of a water-insoluble and alkali-soluble resin contained in the thermosensitive layer is novolac resin is very useful, since press life thereof is greatly improved, by burning-in processing, to an extent that may not be expected from the conventional technological common sense.

DETAILED DESCRIPTION OF THE PREFERRED EMBODIMENTS

Figure 1:
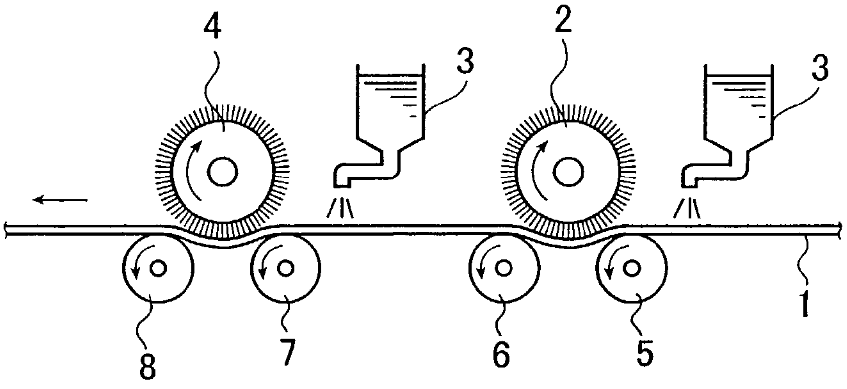
FIG. 1 is a side view showing a concept of a brush graining process used for mechanical graining in preparation of an aluminum support used for a presensitized plate of the present invention.

The present invention is described below in detail.

[An Aluminum Support]

<Aluminum Plate (Rolled Aluminum)>

An aluminum plate used for a presensitized plate of the present invention is metal having dimensional stable aluminum as the main component and are composed of aluminum or aluminum alloy. Besides a pure aluminum plate, alloy with aluminum as the main component containing very small quantity of different elements, plastic film or paper laminated or vapor deposited with aluminum or aluminum alloy may be used.

Hereinafter, various plates composed of aluminum or aluminum alloy described before are referred to as an aluminum plate as a generic name. Different elements that may be contained in the aluminum alloy are silicon, iron, manganese, copper, magnesium, chromium, zinc, bismuth, nickel, titanium and so on. The content in the aluminum alloy is 10 wt % or less.

A pure aluminum plate is preferably used in the present invention, but since it is difficult to produce perfectly pure aluminum from the viewpoint of refining technology, aluminum containing tiny quantity of different elements may be allowable. Composition of the aluminum plate used in the present invention is not specified in this way and materials well-known before such as JIS A1050, JIS A1100, JIS A3005, JIS A3004, International registered alloy 3103A and the like may be used as occasion arises.

Among them, an aluminum plate used in the present invention preferably composed of aluminum containing 0.005 wt % or less of Cu, more preferably composed of aluminum containing 0.1 wt % or less of Si, 0.005 wt % or less of Cu, and 0.5 wt % or less of Fe. These aluminum are aluminum alloy that are generally classified into JIS A1050 material or JIS A1070 material. If an aluminum plate has such composition, diameter of pits generated in especially electrolytic graining will be smaller. Thus, scum resistance is better. In addition, in combination with a non-silicate developer (developer containing substantially no alkali metal silicates), both scum resistance and press life are better and well balanced. Particularly, an aluminum plate is preferably composed of aluminum containing 0.02 to 0.1 wt % of Si, 0.005 wt % or less of Cu, and 0.1 to 0.5 wt % of Fe.

For the aluminum plate to be used in the present invention, mean crystal grain diameters of the aluminum should preferably be 2 to 200 μm in a minor axis and 50 to 1500 μm in a major axis. Since crystal grains have different etching performance for each crystal orientation, an excessively large crystal grain will make a uniform surface graining treatment difficult. On the other hand, an excessively small crystal grain increases strength of the aluminum plate, resulting in decrease in handling suitability.

With regard to a production method of an aluminum plate, continuous casting and DC casting can be used, and also an aluminum plate produced without an annealing process and soaking in the DC casting can be used. The aluminum plate having asperity by laminated rolling or transcription in the final rolling process may be used. Thickness of aluminum plates used in the present invention is around 0.1 to 0.6 mm. This thickness may be changed depending on size of a printing machine, size of a printing plate and user requires.

The aluminum support used in the presensitized plate of the present invention is obtained by providing the aluminum plate with a specific surface profile.

The manufacturing method of the aluminum support is not particularly limited. The aluminum support is, for example, obtained by providing surface graining treatment and anodizing treatment on the aluminum support. Further, a manufacturing method of the aluminum support may include various steps other than these (such as alkali-etching treatment, desmutting treatment by acid, or the like).

A preferable manufacturing method of the aluminum support is, specifically, to provide the aluminum plate with two or more types of treatments selected from a group consisting of mechanical graining treatment, elecrochemical graining treatment by an electrolyte containing a nitric acid, electrochemical graining treatment by an electrolyte containing a hydrochloric acid, and chemical dissolving treatment by an alkali aqueous solution. Combination of a plurality of types of treatment as above allows a complicated profile to be formed which a single type of treatment cannot form. Thus, it is possible to improve press life by increasing a surface area of the support while reducing a sharp portion attributed to scum resistance.

More specifically, a method to provide the aluminum plate with mechanical graining treatment, alkali-etching treatment, desmutting treatment by an acid, electrochemical graining treatment by an electrolyte containing a nitric acid, and electrochemical graining treatment by an aqueous solution containing hydrochloric acid, in this order; a method to provide the aluminum plate with alkali etching treatment, desmutting treatment by an acid, and electrochemical graining treatment by an aqueous solution containing a hydrochloric acid, in this order; a method further provide alkali etching treatment by an alkali aqueous solution with a dissolved amount of aluminum of 0.5 $g/m^2$ or less, subsequent to the electrochemical graining treatment by an aqueous solution containing a hydrochloric acid, in these methods. These methods may include other treatment.

A presensitized plate thus obtained by one of these methods is a preferable form of the present invention.

Hereafter, various type of surface treatment provided on an aluminum plate will be explained.

<Surface Graining Treatment>

The aforementioned aluminum plate is subjected to graining treatment to form a more preferable shape.

An aluminum support used in the present invention needs to have a grain shape with a double structure comprising a grained structure with large undulation and a grained structure with small undulation, or a triple structure comprising a grained structure with large undulation, a grained structure with medium undulation, and a grained structure with small undulation. When a support surface has a double structure comprising a grained structure with large undulation and a grained structure with small undulation, a mean wavelength of the grained structure with large undulation should be 0.5 to 30 μm, and preferably should be 2 to 30 μm. Further, a mean wavelength of the grained structure with small undulation should be 0.01 to 0.6 μm, and preferably should be 0.01 to 0.3 μm. When a support surface has a triple structure comprising a grained structure with large undulation, a grained structure with medium undulation and a grained structure with small undulation, a mean wavelength of the grained structure with large undulation should be 0.5 to 30 μm, and preferably should be 2 to 30 μm. Further, a mean wavelength of the grained structure with medium undulation should be 0.6 to 2.0 μm, and preferably should be 0.6 to 1.5 μm and a mean wavelength of the grained structure with small undulation should be 0.01 to 0.6 μm, and preferably should be 0.01 to 0.3 μm. In any case, a mean wavelength of the grained structure with large undulation should, more preferably, be 2 to 15 μm, and a mean wavelength of the grained structure with small undulation should more preferably, be 0.05 to 0.3 μm.

In the present invention, an area ratio (steepness degree a45) of a portion in the aluminum support where an angle of inclination is 45° or more should preferably be 3% or more, and more preferably be 10% or more. Meanwhile, it should preferably be 35% or less, and more preferably be 29% or less. When the area ratio is within the aforementioned range, a balance between press life and scum resistance is particularly excellent.

The steepness degree a45 may be measured with an atomic force microscope (AFM). For example, SP13700 manufactured by Seiko Instruments Inc. may be used as AFM.

A measurement method of the steepness degree a45 in the examples as later described will be as follows.

An aluminum plate sample cut by 1 cm square was set on a horizontal sample bench on a piezo scanner. A cantilever was made to approach a surface of the sample, and when it reaches a region where atomic force was applied thereto, the sample was scanned in the XY directions. At that time, asperities of the sample was captured as displacement of piezo in the Z direction. A piezo scanner capable of scanning 150 μm in the XY directions and 10 μm in the Z direction was used. A cantilever with a resonance frequency of 120 to 150 kHz and spring constant of 12 to 20 N/m (SI-DF20, manufactured by Nanoplobes, Inc.) was used, and measurement was made in a dynamic force mode (DFM). A slight inclination of the sample was corrected by approximating the obtained three-dimensional data by least square method and a reference surface was corrected.

For measurement of an angle of inclination, a measurement range of 120 μm square was measured from four fields of vision, namely a measurement range of 240 μm square was performed. Resolution was 1.9 μm in the XY directions, and 1 nm in the Z direction, and a scanning rate was 60 μm/sec. For obtaining a ratio of an angle of inclination of the surface, three points adjacent to each other were extracted from the three-dimensional data, and an angle of a minimal triangle formed by the three points with respect to the reference surface was calculated for all data to obtain an angle of inclination distribution curve. Using this data, an area ratio (a45) of a portion where an angle of inclination is 45 degree or more was calculated.

As a graining treatment method, there is mechanical graining as described in JP 56-28893 A (the term "JP XX-XXXXXX A" as used herein means an "unexamined published Japanese patent application"), chemical etching, electrolytic graining and the like. Furthermore, an electrochemical graining (electrolytic graining) method graining a surface of aluminum in hydrochloric acid electrolytic solution or nitric acid electrolytic solution electrochemically, a mechanical graining method such as a wire brushing graining method scratching a surface of aluminum with metal wire, a ball graining method graining a surface of aluminum with abrasives and a graining ball, a brush graining method graining the surface with nylon brushes and abrasives and the like, may be used. These graining methods may be used alone or in combination of those such as combination of mechanical graining with nylon brushes and abrasives and combination of multiple electrolytic graining treatments.

In the case of a brush graining method, by selecting properly conditions such as an average diameter of particles used as an abrasive, the maximum diameter of the particles, diameters of bristles of the brush, density of the bristles, pressing pressure and the like, it is possible to control an average depth of concave portions in long wavelength components (large undulation) on the surface of a support for a lithographic printing plate. At the concave portions obtained by the brush graining method, the mean wavelength is preferably 0.5 to 30 μm, more preferably 2 to 30 μm, much more preferably 2 to 15 μm and average depth is preferably 0.3 to 2.0 μm, more preferably 0.3 to 1 μm.

Among those graining methods, a preferable method for making a grained surface used in the present invention is an electrochemical method graining the surface chemically in the hydrochloric acid electrolytic solution or nitric acid electrolytic solution. Preferable electricity quantity is 50 to 400 C/dm$^2$ as an anode electricity quantity. Further concretely, for example, it is carried out in electrolytic solution containing hydrochloric acid or nitric acid of 0.1 to 50 wt % under such conditions as at 20 to 100° C. of temperature, 1 second to 30 minutes of time, 100 to 400 C/dm$^2$ of electricity quantity, and 1 to 100 A/dm$^2$ of current density, using direct current or alternating current. Since the electrochemical graining can easily process fine asperities on the surface, it can improve adhesion between the thermosensitive layers and the support.

By electrolytic graining treatment after mechanical graining treatment, crater-shaped or honeycomb-shaped pits, for example, the ones having an average diameter of about 0.01 to 2.0 μm, preferably 0.01 to 0.3 μm, more preferably 0.05 to 0.2 μm and an average depth of 0.01 to 0.4 μm, are formed on the surface of the aluminum plate at an area rate of 90 to 100%, thereby forming of large-and-small complex pit structure comprising 2 different frequency undulations. Moreover, by carrying out electrolytic graining treatment twice or more, it is possible to form a large-medium-and-small complex structure comprising 3 different frequency undulations.

The pits formed have functions to improve scum resistance and press life of the non-image areas of the printing plates. In the electrolytic graining treatment, the quantity of electricity, that is, the product of electric current and running time for the current, which is required for forming adequate pits on the surface, is an important condition. It is desirable to form adequate pits by less amount of electricity from a viewpoint of energy saving.

Surface roughness after the graining treatment is preferably 0.2 to 0.6 μm at the arithmetical mean roughness ($R_a$) measured at 0.8 mm of cut-off value, 3.0 mm of evaluation length in accordance with JIS B0601-1994.

<Alkali Etching Treatment>

It is preferable that chemical etching with an alkali is performed on a graining-treated aluminum plate in the above-described manner.

An alkali agent used suitably in the present invention includes sodium hydroxide, sodium carbonate, sodium aluminate, sodium metasilicate, sodium phosphate, potassium hydroxide, lithium hydroxide but not limited to these.

The alkali etching is preferably performed in the condition that dissolving amount of Al is 0.05 to 0.5 $g/m^2$. Especially, when it is carried out after the electrolytic graining treatment (the last electrolytic graining, if the electrolytic graining treatment is carried out twice or more), dissolving amount of Al is preferably 0.5 $g/m^2$ or lower. If dissolving amount of Al is more than 0.5 $g/M^2$ in the alkali etching treatment after the electrolytic graining treatment (the last electrolytic graining, if the electrolytic graining treatment is carried out twice or more), grain shape may be more flat and adhesion between the thermosensitive layers and the support may depressed drastically.

As other conditions are also not limited, alkali concentration is preferably 1 to 50 wt %, more preferably 5 to 30 wt % and alkali temperature is preferably 20 to 100° C., more preferably 30 to 50° C.

The alkali etching is not limited to one method but combination of multiple methods may be used.

The alkali etching treatment is not limited to processing within one stage. For example, alkali etching treatment may be provided after mechanical graining treatment. This is followed by desmutting treatment (i.e. cleansing by acid for removing smut as later described) and electrolyte graining treatment, and further by the alkali etching treatment again, and desmutting treatment. Like this, combined use of a plurality of times of alkali etching treatment and desmutting treatment, respectively, is possible.

The alkali etching allows controlling diameter of pits constituting a grained structure with medium undulation into a preferable range to some extent, and also forming inside the pit a grained structure with small undulation composed of micro asperities. The micro asperities are amorphous, and a diameter of an equivalent circle (i.e. diameter of a circle with an equivalent area) should preferably be 0.01 to 0.6 μm.

As above, as a result of combining various graining treatment and alkali etching treatment, it is possible to form a double structure comprising a grained structure with large undulation and a grained structure with small undulation, or a triple structure comprising a grained structure with large undulation, a grained structure with medium undulation, and a grained structure with small undulation.

After the alkali etching treatment, washing (desmutting treatment) with acid may be carried out to remove smut remained on the surface. Acid to be used includes, for example, nitric acid, sulfuric acid, phosphoric acid, chromic acid, hydrofluoric acid and borofluoric acid. In particular, as a method for removing smut after electrolytic graining treatment, the method in which smut is made contact to sulfuric acid of 15 to 65 wt % at 50 to 90° C. of temperature, as described in JP 53-12739 A is preferable.

<Anodizing Treatment>

Anodizing treatment is preferably performed on an aluminum plate treated as described above. Here, it is preferable that a number of micropores in the anodized layer are decreased as far as possible in order to suppress the sensitivity deterioration attributed by the micropores. With regard to the anodizing treatment, methods that have been conventionally used in this field can be used. Specifically, when direct current or alternating current is fed to the aluminum plates in aqueous solution mainly containing sulfuric acid and optionally containing phosphoric acid, chromic acid, oxalic acid, sulfamic acid, benzene-sulfonic acid and the like, an anodized layer can be formed on the surface of the aluminum plate.

In this case, even if any ingredient contained in Al alloy plate, electrode, city water, underground water and the like is contained in the electrolytic solution, there is no problem. Further, containing of the second and third ingredients is also allowable. The second and third ingredients herein include ion of metal such as Na, K, Mg, Li, Ca, Ti, Al, V, Cr, Mn, Fe, Co, Ni, Cu, Zn and the like; cation such as ammonium ion; anion such as nitric acid ion, carbonic acid ion, chloride ion, phosphoric acid ion, fluoride ion, sulfurous acid ion, titanic acid ion, silicic acid ion and boric acid ion. Containing 0 to 10000 ppm of those ions is allowable.

Since conditions for anodizing treatment change variously depending on the electrolytic solution being used, those are not decided unconditionally, but it is generally appropriate that concentration of electrolytic solution is 1 to 15 wt %, temperature of solution is −5 to 40° C., current density is 5 to 60 $A/dm^2$, voltage is 1 to 200V, time for electrolysis is 10 to 200 seconds.

In the present invention, quantity of the anodized layers is preferably 1 to 5 $g/m^2$. If it is less than 1 $g/m^2$, plates are scratched easily. And if it is more than 5 $g/m^2$, much quantity of electricity is needed for the production, which is economically disadvantaged. Quantity of the anodized layers is preferably 1.5 to 4 $g/m^2$.

<Treatment with Alkali Metal Silicate>

The aluminum support obtained by forming the anodized layer described above is performed immersing treatment in alkali metal silicate water solution as required. Conditions of the treatment are not particularly limited, and for example the immersing treatment may be performed by using the water solution having concentration of 0.01 to 5.0 wt %, at 5 to 40° C. for 1 to 60 seconds. After that, it may be rinsed by flowing water. Temperature of the immersing treatment is more preferably 10 to 40° C. and immersing time is more preferably 2 to 20 seconds.

Alkali metal silicate used in the present invention includes, for example, sodium silicate, potassium silicate, and lithium silicate. Alkali metal silicate water solution may contain sodium hydroxide, potassium hydroxide, lithium hydroxide or the like in adequate amount.

Further, alkali metal silicate water solution may contain alkaline earth metal salt and/or the group 4 (IVA) metal salt. As the alkaline earth metal salt, for example, nitrate such as calcium nitrate, strontium nitrate, magnesium nitrate, barium nitrate or the like; sulfate; chloride; phosphate; acetate; oxalate; borate are included. As the group 4 (IVA) metal salt, for example, titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride are included. Alkaline earth metal salt and the group 4 (IVA) metal salt described above may be used alone or in combination of 2 or more.

Si quantity adsorbed by the treatment with alkali metal silicate is measured with a fluorescent X-ray analyzer and the quantity is preferably about 1.0 to 15.0 $mg/M^2$.

Solubility resistance of the surface of the aluminum support to the alkali developer can be improved by this treatment with alkali metal silicate to restrain elution of aluminum components into the developer and to decrease generation of development residue caused by developer exhaustion.

[Image Formation Layer]

The presensitized plate according to the present invention is provided with a thermosensitive layer mentioned later on the aluminum support obtained as described above. It is preferable that an undercoat readily soluble in alkali is provided beneath the thermosensitive layer. The undercoat readily soluble in alkali has an action that allows the hydrophilic surface of the support and the thermosensitive layer to be firmly adhered to each other in an image area, thereby realizing an excellent press life and also has an action that allows the undercoat to be easily eluted in an alkali developer at the time of development in a non-image area to expose the hydrophilic surface of the support, thereby realizing an excellent scum resistance.

<Undercoat Layer>

While the undercoat layer readily soluble in alkali in the presensitized plate of the present invention is not particularly limited as far as it is readily soluble in alkali, it is preferred to contain polymers including monomers having acid groups and it is more preferred to contain polymers with monomers having acid groups and including monomers having onium groups.

Details of polymers included in the undercoat layer will be explained below. The polymer included in the undercoat layer is a compound produced by polymerization of monomers having at least one acid group. And preferably, it is a compound produced by polymerization of monomers having acid groups and monomers having onium groups.

The acid groups here used are, preferably, those with acid dissociation constant ($pK_a$) of 7 or less, more preferably, $—COOH$, $—SO_3H$, $—OSO_3H$, $—PO_3H_2$, $—OPO_3H_2$, $—CONHSO_2$, $—SO_2NHSO_2—$, and particularly $—COOH$ are preferred.

On the other hand, preferred onium groups are those containing any atoms belonging to the group 15 (VB group) or the group 16 (VIB group) in the periodic table, more preferred onium groups are those containing nitrogen atoms, phosphorus atoms or sulfur atoms, and an onium group containing nitrogen atoms is particularly preferred.

Polymers used in the present invention are those polymer compounds characterized in that their main chain structure is preferably a vinyl polymer such as acrylic resin, methacrylic resin or polystyrene, urethane resin, polyester or polyamide. More preferably, the main chain structure is a polymer compound characterized in that it is a vinyl polymer such as acrylic resin, methacrylic resin or polystyrene. Particularly preferred is the polymer compound characterized in that the monomer having an acid group is a compound expressed in the general formula (1) or (2) and the monomer having an onium group is a compound expressed in the general formulas (3), (4) or (5) being described later.

(1)

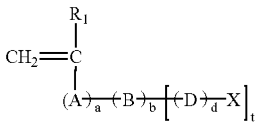

-continued (2)

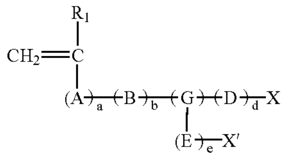

In formulas, A represents a divalent combination group and B represents a divalent aromatic group or a substituted aromatic group. D and E represent independently a divalent combination group respectively. G represents a trivalent combination group. X and X' represent independently an acid group with $pK_a$ of 7 or less, or its alkali metal salt or ammonium salt respectively. $R_1$ represents a hydrogen atom, an alkyl group or a halogen atom. Reference codes a, b, d and e represent independently an integer of 0 or 1 respectively. The reference code t represents an integer of 1–3.

In a monomer having an acid group, preferably, A represents a single bond, —COO— or —CONH—, and B represents a phenylene group or a substituted phenylene group where the substutuent is a hydroxy group, a halogen atom or an alkyl group. D and E represent independently an alkylene group or a divalent combination group that is expressed with molecular formulas $C_nH_{2n}O$, $C_nH_{2n}S$ or $C_nH_{2n+1}N$, respectively. G represents a trivalent combination group that is expressed with molecular formulas $C_n H_{2n-1}$, $C_nH_{2n-1}O$, $C_nH_{2n-1}S$ or $C_nH_{2n}N$. Provided, that n represents an integer of 1–12. X and X' represent independently a carboxylic acid, sulfonic acid, phosphonic acid, a sulfuric monoester or a phosphoric monoester phosphorate, respectively. $R_1$ represents a hydrogen atom or an alkyl group. Reference codes a, b, d and e represent independently 0 or 1 respectively, but a and b are not 0 at the same time. In monomers having an acid group, particularly preferable one is a compound expressed with the general formula (1), wherein B represents a phenylene group or a substituted phenylene group where the substituent is a hydroxy group or an alkyl group of 1 to 3 carbon atoms. D and E represent independently an alkylene group of 1 to 2 carbon atoms or an alkylene group of 1 to 2 carbon atoms combined with an oxygen atom respectively. $R_1$ represents a hydrogen atom or an alkyl group. X represents a carboxylic acid. The reference code a is 0, and b is 1.

Concrete examples of monomers having an acid group are shown below. However, the present invention is not limited to these examples.

(Concrete Examples of Monomers Having an Acid Group)

acrylic acid, methacrylic acid, crotonic acid, isocrotonic acid, itaconic acid, maleic acid, maleic anhydride

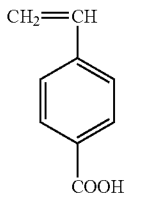
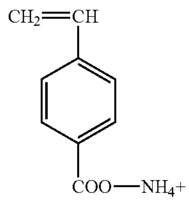
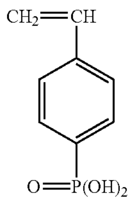

-continued
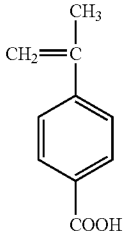
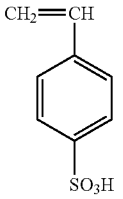
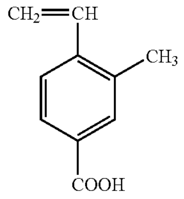
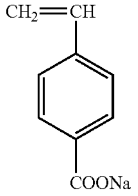
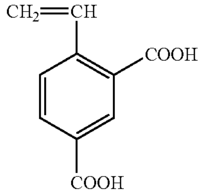
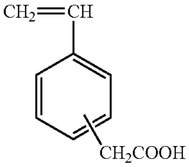
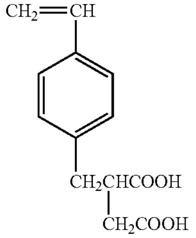
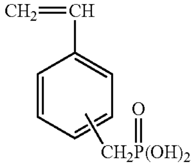
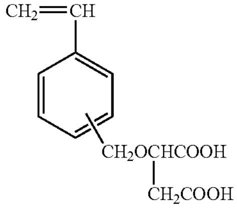
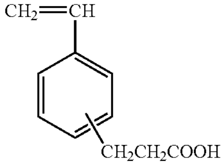
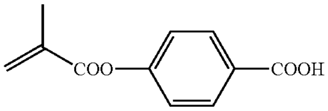
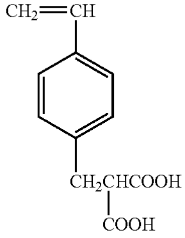
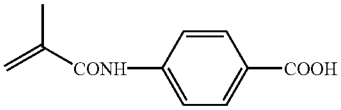
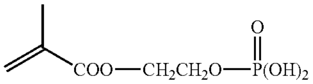
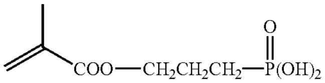
-continued
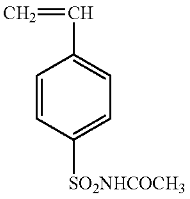
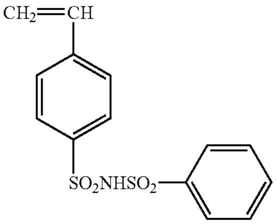
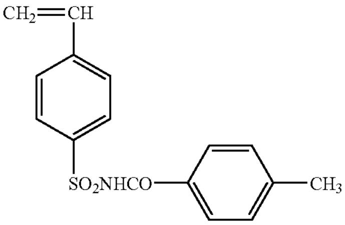
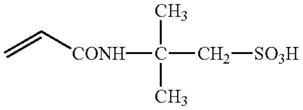
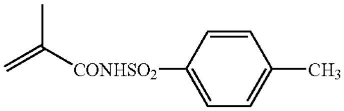
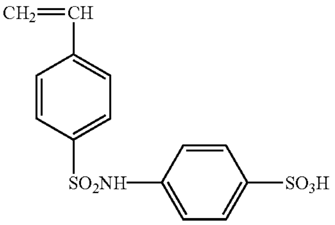
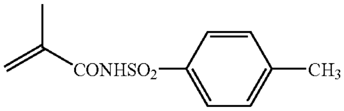
Next, polymers including a monomer having an onium group expressed by one of the following formulas (3), (4) or (5) will be explained.
(3)
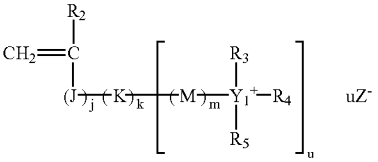
(4)
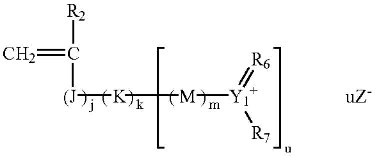
(5)
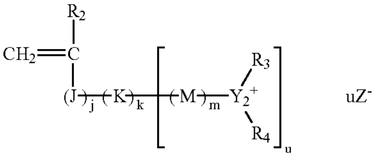

In formulas, J represents a divalent combination group. K represents a divalent aromatic group or a substituted aromatic group. M represents a divalent combination group. $Y_1$ represents an atom of the group 15 (VB group) in the periodic table, and $Y_2$ represents an atom of the group 16 (VIB group) in the periodic table. $Z^-$ represents a counter anion. $R_2$ represents a hydrogen atom, an alkyl group or a halogen atom. $R_3$, $R_4$, $R_5$ and $R_7$ represent independently a hydrogen atom or, an alkyl group, an aromatic group or an aralkyl group that may be bonded with substituents if circumstances require, respectively, and $R_6$ represents an alkylidyne or a substituted alkylidyne, but $R_3$ and $R_4$, and, $R_6$ and $R_7$ may form a ring respectively by bonding to each other. Reference codes j, k and m represent independently 0 or 1 respectively. The reference code u represents an integer of 1–3.

In monomers having onium groups, more preferably, J represents —COO— or —CONH—, and K represents a phenylene group or a substituted phenylene group where the substutuent is a hydroxy group, a halogen atom or an alkyl group. M represents an alkylene group or a divalent combination group that is expressed with molecular formulas $C_nH_{2n}O$, $C_nH_{2n}S$ or $C_nH_{2n+1}N$. Provided, that n represents an integer of 1 to 12. $Y_1$ represents a nitrogen atom or a phosphorus atom and $Y_2$ represents a sulfur atom. $Z^-$ represents a halogen ion, $PF_6^-$, $BF_4^-$ or $R_8SO_3^-$. $R_2$ represents a hydrogen atom or an alkyl group. $R_3$, $R_4$, $R_5$ and $R_7$ represent independently a hydrogen atom or, an alkyl group, an aromatic group or an aralkyl group of 1 to 10 carbon atoms that may be bonded with substituents if circumstances require, respectively, and $R_6$ represents an alkylidyne or an substituted alkylidyne of 1 to 10 carbon atoms. $R_3$ and $R_4$, and, $R_6$ and $R_7$ may form a ring respectively by bonding to each other. Reference codes j, k and m represent independently 0 or 1 respectively, however, j and k are not 0 at the same time. $R_8$ represents an alkyl group, an aromatic group or an aralkyl group of 1 to 10 carbon atoms that may be bonded with substituents.

Among monomers having onium groups, more preferably K represents a phenylene group or a substituted phenylene group where the substutuent is a hydrogen atom or an alkyl group of 1 to 3 carbon atoms. M represents an alkylene group of 1 to 2 carbon atoms or an alkylene group of 1 to 2 carbon atoms combined with an oxygen atom. $Z^-$ represents a chlorine ion or $R_8SO_3^-$. $R_2$ represents a hydrogen atom or a methyl group. The reference code j is 0 and k is 1. $R_8$ represents an alkyl group of 1 to 3 carbon atoms.

Concrete examples of the monomers having onium groups are shown below. However, the present invention is not limited to those examples.

(Concrete Examples of Monomers Having Onium Groups)

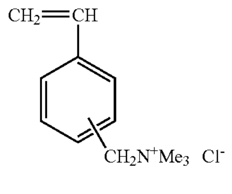

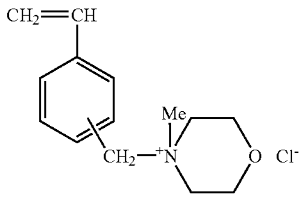

-continued

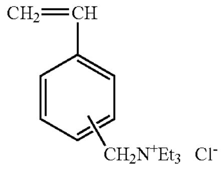

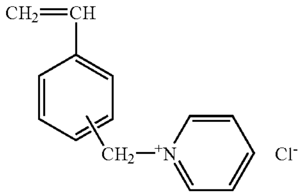

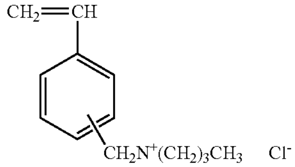

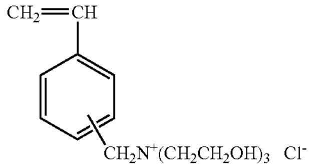

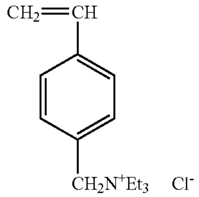

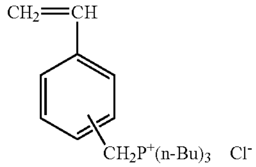

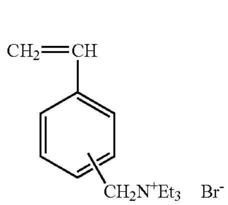

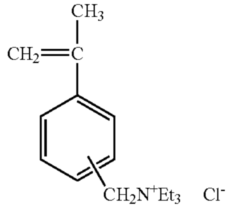

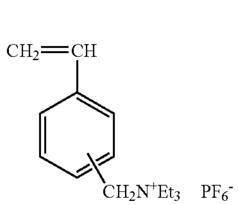

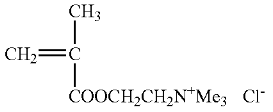

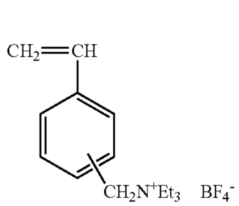

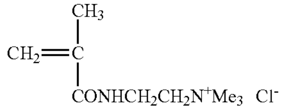

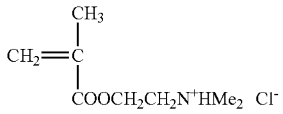

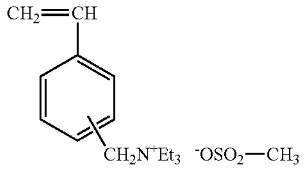

-continued

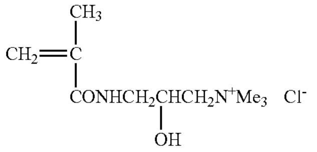

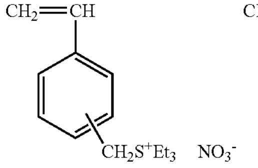

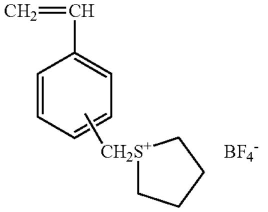

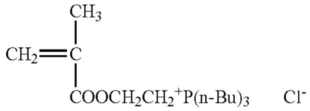

Monomers with acid groups may be used either alone or in a combination of two or more of them, and also, monomers with onium groups may be used either alone or in a combination of two or more of them. Further, polymers used in accordance with the present invention may be used as a mixture of two or more polymers that are different in monomers, the composition ratio or the molecular weight. In this case, the polymer having a monomer with an acid group as a polymerization ingredient has, preferably more than 1 mol %, and more preferably more than 5 mol % of the monomer with an acid group, and also, the polymer having a monomer with an onium group as a polymerization ingredient has, preferably more than 1 mol %, and more preferably more than 5 mol % of the monomer with an onium group.

In addition, these polymers may contain at least one kind of monomers selected from (1)–(14) shown below as a copolymer ingredient.

(1) Acrylamides, methacrylamides, acrylic esters, methacrylic esters metharylates and hydroxystyrenes such as N-(4-hydroxyphenyl) acrylamide, N-(4-hydroxyphenyl) methacrylamide; o-, m- or p-hydroxystyrene, o- or m-bromo-p-hydroxystyrene, o- or m-chloro-p-hydroxystyrene and o-, m- or p-hydroxyphenyl acrylate or methacrylate;

(2) unsaturated carboxylic acids such as acrylic acid, methacrylic acid, maleic acid and maleic anhydride and half ester thereof; itaconic acid and itaconic anhydride and half ester thereof;

(3) acrylamides such as N-(o-aminosulfonyl phenyl) acrylamide, N-(m-aminosulfonyl phenyl) acrylamide, N-(p-aminosulfonyl phenyl) acrylamide, N-[1-(3-aminosulfonyl) naphthyl] acrylamide, N-(2-aminosulfonyl ethyl) acrylamide; methacrylamides such as N-(o-aminosulfonyl phenyl) methacrylamide, N-(m-aminosulfonyl phenyl) methacrylamide, N-(p-aminosulfonyl phenyl) methacrylamide, N-[1-(3-aminosulfonyl)naphthyl] methacrylamide, N-(2-aminosulfonyl ethyl) methacrylamide; also, unsaturated sulfonamides of acrylic esters and the like such as o-aminosulfonyl phenyl acrylate, m-aminosulfonyl phenyl acrylate, p-aminosulfonyl phenyl acrylate, 1-(3-aminosulfonyl phenyl naphthyl) acrylate; unsaturated sulfonamides of methacrylic esters and the like esters such as o-aminosulfonyl phenyl methacrylate, m-aminosulfonyl phenyl methacrylate, p-aminosulfonyl phenyl methacrylate, 1-(3-aminosulfonyl phenyl naphthyl) methacrylate;

(4) phenyl sulfonyl acrylamides that may have a substituent such as tosylacrylamide and phenyl sulfonyl methacrylamides that may have a substituent such as tosylmethacrylamide;

(5) acrylic esters and methacrylic esters that have an aliphatic hydroxy group, for example, 2-hydroxyethyl acrylate or 2-hydroxyethyl methacrylate;

(6) (substituted) acrylic esters acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N-dimethylamino ethyl acrylate;

(7) (substituted) methacrylic esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N-dimethylamino ethyl methacrylate;

(8) acrylamides or methacrylamides such as acrylamide, methacrylamide, N-methylol acrylamide, N-methylol methacrylamide, N-ethyl acrylamide, N-ethyl methacrylamide, N-hexyl acrylamide, N-hexyl methacrylamide, N-cyclohexyl acrylamide, N-cyclohexyl methacrylamide, N-hydroxyethyl acrylamide, N-hydroxyethyl methacrylamide, N-phenyl acrylamide, N-phenyl methacrylamide, N-benzyl acrylamide, N-benzyl methacrylamide, N-nitrophenyl acrylamide, N-nitrophenyl methacrylamide, N-ethyl-N-phenyl acrylamide and N-ethyl-N-phenyl methacrylamide;

(9) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(10) vinyl esters such as vinyl acetate, vinyl chloroacetate, vinyl butylate and vinyl benzoate;

(11) styrenes such as styrene, α-methyl styrene, methyl styrene and chloromethyl styrene;

(12) vinyl ketones such as methyl vinyl ketone, ethyl vinyl ketone, propyl vinyl ketone and phenyl vinyl ketone;

(13) olefins such as ethylene, propylene, isobutylene, butadiene and isoprene;

(14) N-vinyl pyrrolidone, N-vinyl carbazole, 4-vinyl pyridine, acrylonitrile, methacrylonitrile and the like.

For the polymer used here, the one containing a monomer having an acid group not less than 1 mol % is preferable and the one containing the same not less than 5 mol % is more preferable, and also, the one containing a monomer having an onium group not less than 1 mol % is preferable and the one containing the same not less than 5 mol % is more preferable. In addition, if a monomer having an acid group is contained by 20% or more, the dissolution removal at the time of alkali development is facilitated much more. And if a monomer having an onium group is contained by 1 mol % or more, the adhesion is improved much more owing to the synergistic effect with the acid group. Constitutional ingredients having acid groups may be used either alone or in a combination of two or more of them, and also, monomers with onium groups may be used either alone or in a combination of two or more of them. Further, for polymers used in accordance with the present invention they may be used as a mixture of two or more polymers that are different in monomers, the composition ratio or the molecular weight. Then, typical examples of polymers used in the present invention are shown below. The composition ratios of polymer structures represent mole percentages.

TYPICAL EXAMPLES OF POLYMERS
| STRUCTURES | NUMBER-AVERAGE MOLECULAR WEIGHT ($M_n$) |
|---|---|
| No. 1 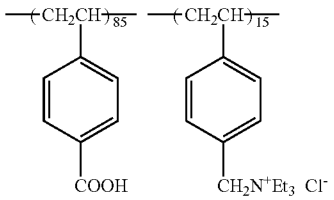 | 2,100 |
| No. 2 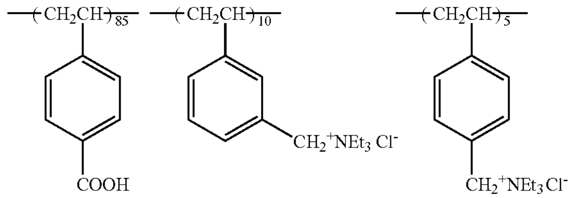 | 4,800 |
| No. 3 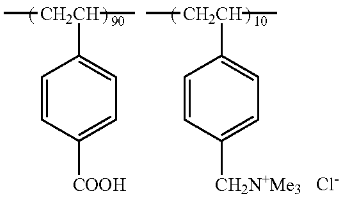 | 3,200 |
| No. 4 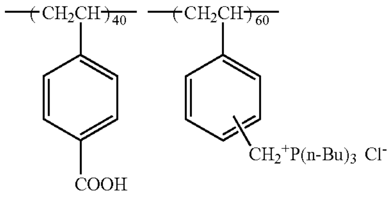 | 2,300 |
| No. 5 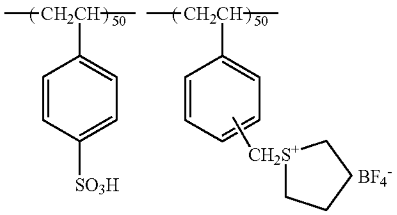 | 1,400 |
| No. 6 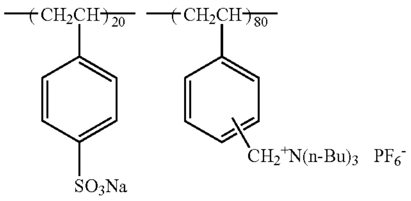 | 4,500 |

-continued
TYPICAL EXAMPLES OF POLYMERS
| STRUCTURES | |
|---|---|
| No. 7 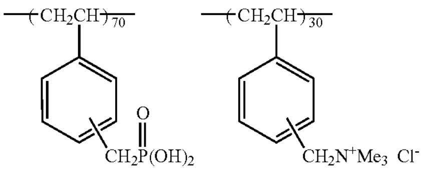 | 5,000 |
| No. 8 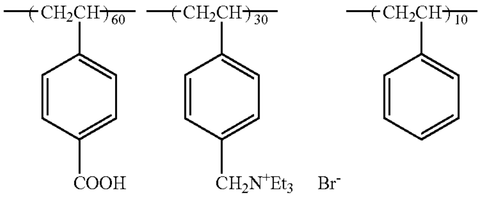 | 1,000 |
| No. 9 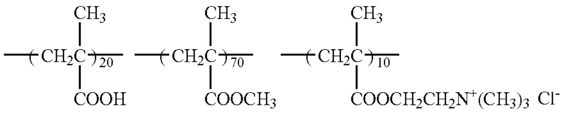 | 1,300 |
| No. 10 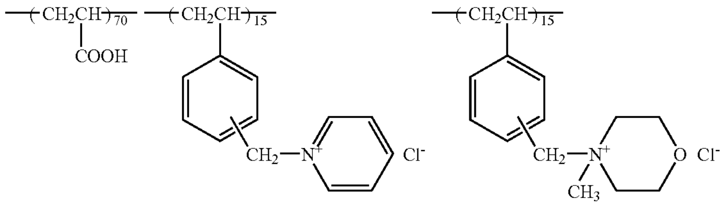 | 2,900 |
| No. 11 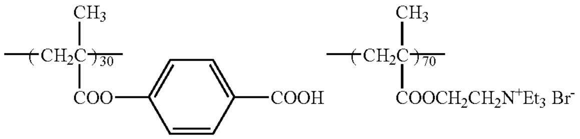 | 800 |
| No. 12 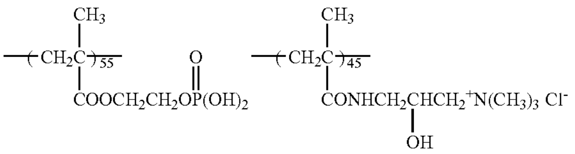 | 300 |
| No. 13 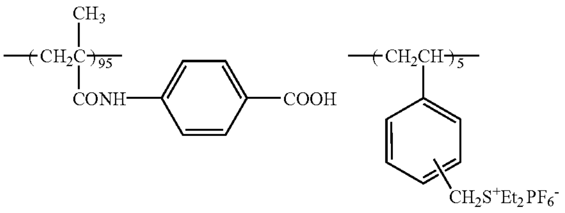 | 1,900 |

-continued
TYPICAL EXAMPLES OF POLYMERS
| STRUCTURES | |
|---|---|
| No. 14 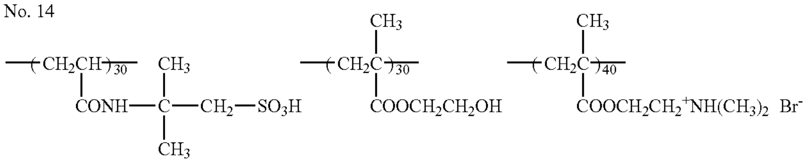 | 4,100 |
| No. 15 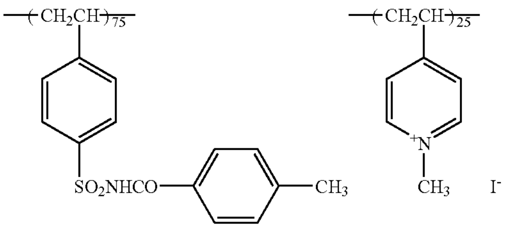 | 3,500 |
| No. 16 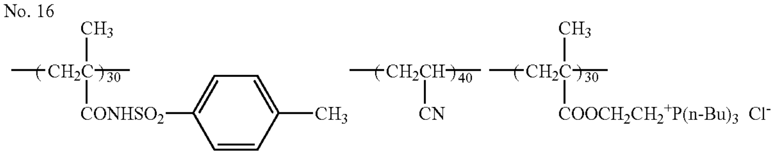 | 3,000 |
| No. 17 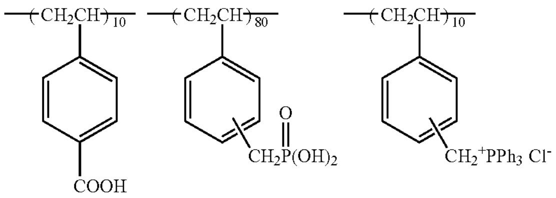 | 3,300 |
| No. 18 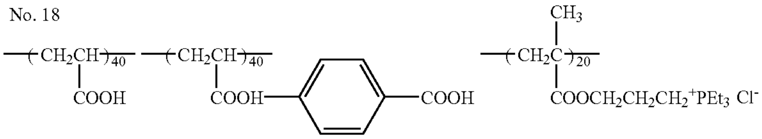 | 600 |
| No. 19 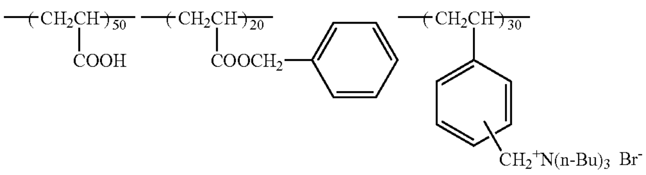 | 5,000 |
| No. 20 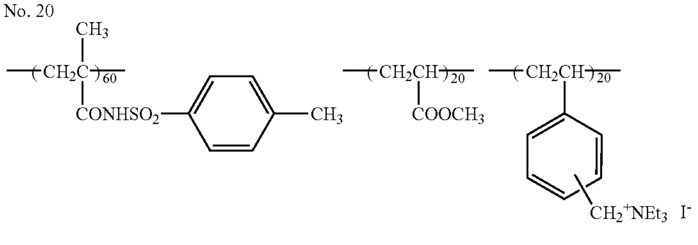 | 2,400 |

-continued
TYPICAL EXAMPLES OF POLYMERS
| STRUCTURES | WEIGHT-AVERAGE MOLECULAR WEIGHT ($M_w$) |
|---|---|
| No. 21 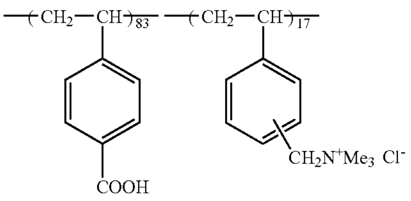 | 32 THOUSANDS |
| No. 22 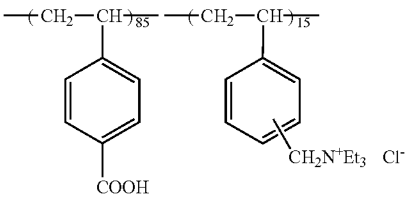 | 28 THOUSANDS |
| No. 23 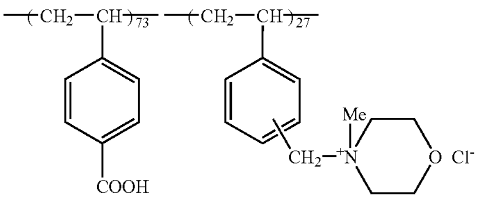 | 26 THOUSANDS |
| No. 24 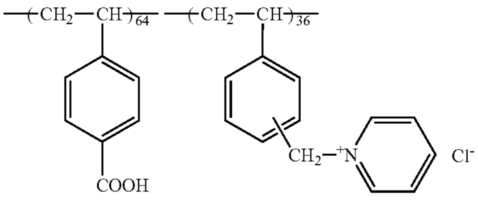 | 41 THOUSANDS |
| No. 25 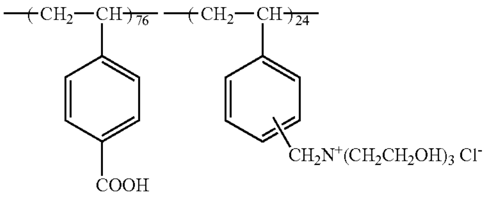 | 11 THOUSANDS |

-continued
| TYPICAL EXAMPLES OF POLYMERS | |
|---|---|
| STRUCTURES | |
| No. 26 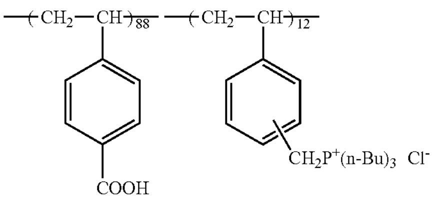 | 17 THOUSANDS |
| No. 27 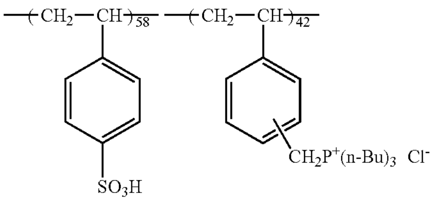 | 36 THOUSANDS |
| No. 28 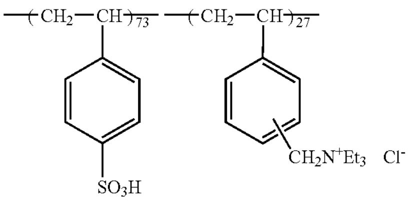 | 22 THOUSANDS |
| No. 29 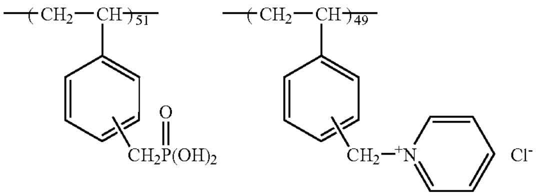 | 44 THOUSANDS |
| No. 30 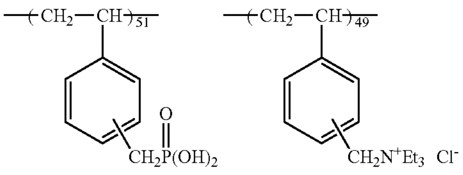 | 19 THOUSANDS |
| No. 31 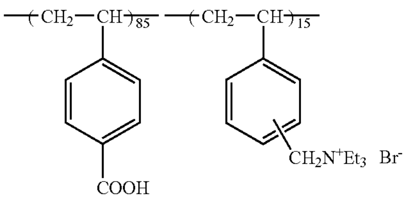 | 28 THOUSANDS |

-continued
TYPICAL EXAMPLES OF POLYMERS
| STRUCTURES | |
|---|---|
| No. 32 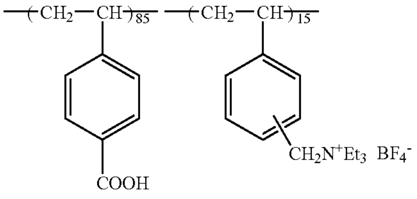 | 28 THOUSANDS |
| No. 33 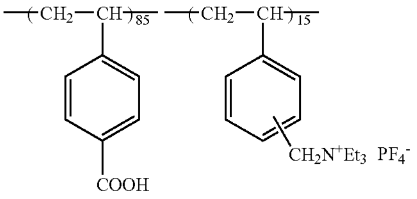 | 28 THOUSANDS |
| No. 34 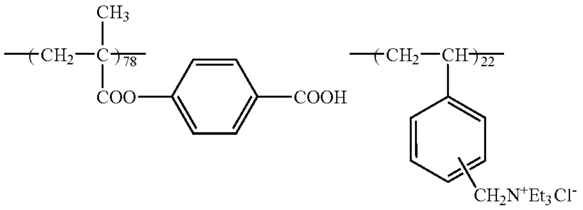 | 34 THOUSANDS |
| No. 35 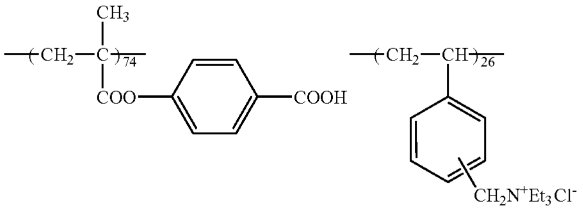 | 42 THOUSANDS |
| No. 36 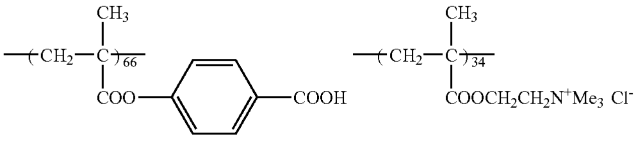 | 13 THOUSANDS |
| No. 37 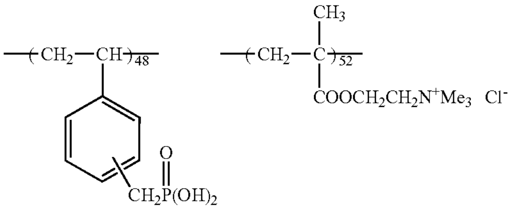 | 15 THOUSANDS |

-continued
| TYPICAL EXAMPLES OF POLYMERS | |
|---|---|
| STRUCTURES | |
| No. 38 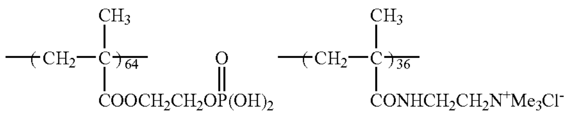 | 46 THOUSANDS |
| No. 39 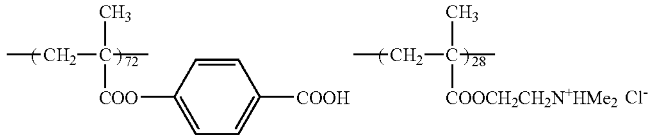 | 34 THOUSANDS |
| No. 40 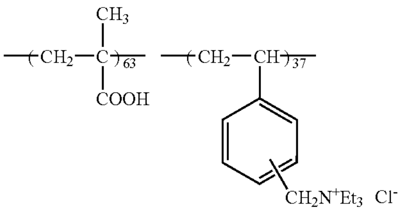 | 63 THOUSANDS |
| No. 41 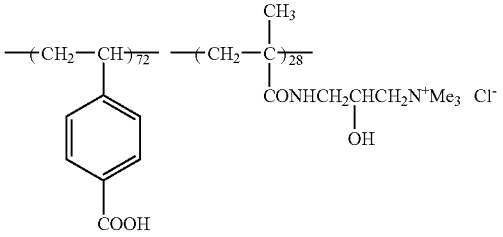 | 25 THOUSANDS |
| No. 42 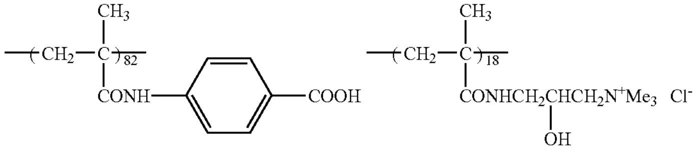 | 25 THOUSANDS |
| No. 43 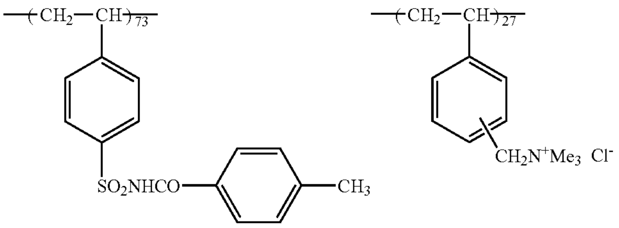 | 33 THOUSANDS |

-continued

TYPICAL EXAMPLES OF POLYMERS

| STRUCTURES | |
|---|---|
| No. 44 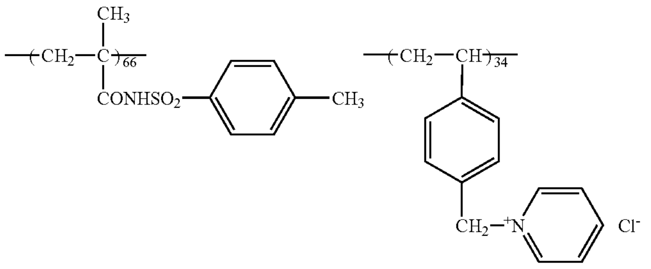 | 41 THOUSANDS |
| No. 45 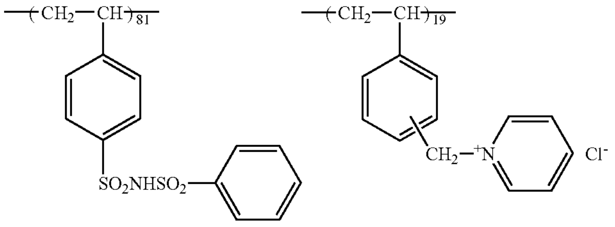 | 14 THOUSANDS |
| No. 46 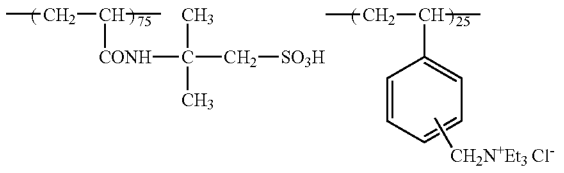 | 22 THOUSANDS |
| No. 47 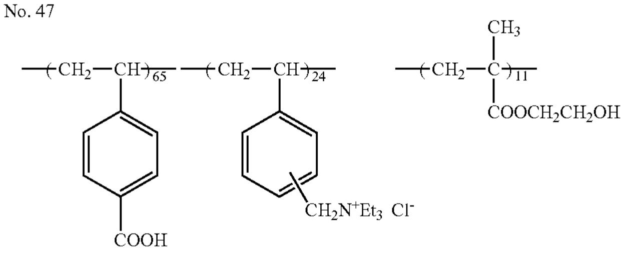 | 23 THOUSANDS |
| No. 48 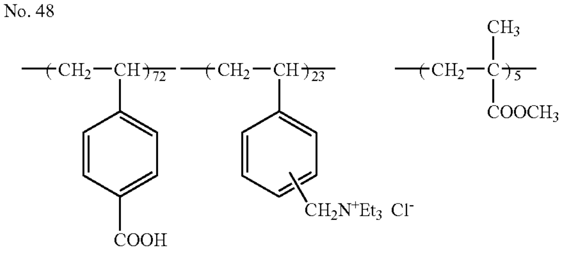 | 47 THOUSANDS |

Polymers used in the present invention can be generally produced using radical chain polymerization processes (refer to "Textbook of Polymer Science" $3^{rd}$ ed. (1984) F. W. Billmeyer, A Wiley-Interscience Publication).

While molecular weights of the polymers used in the present invention can range widely, when measured by using the light scattering method, a weight-average molecular weight ($M_w$) in a range of 500–2,000,000 is preferable, and the range of 1,000–600,000 is more preferable. Also, a number-average molecular weight ($M_n$) calculated with the integrated intensity of end groups and side chain functional groups in the NMR measurement in a range of 300–500,000 is preferable, and the range of 500–100,000 is more preferable. If the molecular weight is smaller than the above range, the adhesion strength to the support becomes weak so that deterioration of the press life may occur. On the other hand, if the molecular weight is larger exceeding the above range, the adhesion strength to the support becomes too strong so that the remains of the thermosensitive layer in the non-image areas may result in insufficient removal. Also, while the quantity of the unreacted monomer contained in the polymer can range widely, being 20 wt % or less is preferable, and being 10 wt % or less is more preferable.

The polymer having a molecular weight in the above range can be obtained by using a polymerization initiator and a chain transfer agent together and adjusting addition levels of them at the time when the corresponding monomers are copolymerized. The chain transfer agent refers to a substance that transfers the active site of the reaction by chain transfer reaction in the polymerization reaction, and the susceptibility of the transfer reaction is expressed by a chain transfer constant $C_s$. The chain transfer constant $C_s \times 10^4$ (60° C.) of the chain transfer agent used in the present invention is preferably 0.01 or more, more preferably 0.1 or more, and 1 or more is particularly preferable. As of the polymerization initiator, peroxides, azo compounds and redox initiators that are generally used in radical polymerization can be utilized with no modification. Among them azo compounds are particularly preferable.

Concrete examples of chain transfer agents include halogen compounds such as carbon tetrachloride and carbon tetrabromide, alcohols such as isopropyl alcohol and isobutyl alcohol, olefins such as 2-methyl-1-butene and 2,4-diphenyl-4-methyl-1-pentene, and sulfur containing compounds such as ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan and phenethylmercaptan, however, the chain transfer agents are not limited to these examples.

More preferred are ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan and phenethylmercaptan, and particularly preferred are ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide and 2-hydroxyethyl disulfide.

Also, while the quantity of the unreacted monomer contained in the polymer can range widely, being 20 wt % or less is preferable, and being 10 wt % or less is more preferable.

Next, description will be made for synthetic examples of the polymer for use in the present invention.

Synthetic Example 1

For synthesis of the polymer (No. 1), 50.4 g of p-vinylbenzoic acid (made by Hokko Chemical Industry Co., Ltd.), 15.2 g of triethyl(p-vinylbenzyl)ammonium chloride, 1.9 g of mercaptoethanol and 153.1 g of methanol were poured into a three-neck flask having a volume of 2 L, heated while being agitated in a flow of nitrogen, and kept at a 60° C. The solution was added with 2.8 g of 2,2'-azobis(isobutyric acid)dimethyl, and continued to be agitated for 30 minutes as it was. Thereafter, a reaction liquid obtained in the above-described manner was dropwise added with a solution obtained by dissolving 201.5 g of p-vinylbenzoic acid, 60.9 g of triethyl(p-vinylbenzyl)ammonium chloride, 7.5 g of mercaptoethanol and 11.1 g of 2,2'dimetylazobis(isobutyric acid) in 612.3 g of methanol for 2 hours. After the end of dropping, the solution was heated to 65° C., and continued to be agitated for 10 hours in a flow of nitrogen. After the end of reaction, the reaction liquid obtained was cooled to a room temperature. A yield of the reaction liquid was 1,132 g, and a concentration of a solid thereof was 30.5 wt %. Moreover, a number-average molecular weight ($M_n$) of a product obtained was obtained by $^{13}$C-NMR spectrum. A value thereof resulted in 2,100.

Synthetic Example 2

For synthesis of the polymer (No. 2), a similar operation to that for the synthetic example 1 was performed except that a mixture with a field m/p: 2/1 of triethyl(vinylbenzyl) ammonium chloride was used in place of triethyl(p-vinylbenzyl)ammonium chloride, and that ethyl mercaptopropionate was used in place of mercaptoethanol. As a result, a polymer having a number-average molecular weight ($M_n$) of 4,800 was obtained.

Synthetic Example 3

For synthesis of the polymer (No. 25), 146.9 g (0.99 mol) of p-vinylbenzoic acid (made by Hokko Chemical Industry Co., Ltd.), 44.2 g (0.21 mol) of vinylbenzyltrimethylammonium chloride and 446 g of 2-methoxyethanol were poured into a three-neck flask having a volume of 1 L, heated while being agitated in a flow of nitrogen, and kept at a 75° C. Next, the solution was added with 2.76 g (12 mmol) of 2,2'-azobis(isobutyric acid) dimethyl, and continued to be agitated. 2 hours later, 2.76 g (12 mmol) of 2,2'-azobis (isobutyric acid) dimethyl was added thereto. 2 more hours later, 2.76 g (12 mmol) of 2,2'-azobis(isobutyric acid) dimethyl was added thereto. After being agitated for 2 more hours, the solution was cooled to a room temperature. The reaction liquid obtained was poured into 12 L of ethyl acetate under agitation. A solid deposited was filtered and dried. A yield thereof was 189.5 g. A molecular weight of the solid obtained was measured by a light dispersion method, and a weight-average molecular weight ($M_w$) thereof resulted in 32 thousands.

Other polymers for use in the present invention are synthesized in the same manner as described above.

Moreover, into the undercoat layer of the presensitized plate of the present invention, a compound represented by the following general formula (6) can be also added as well as the foregoing polymers.

$$(HO)_m—R_1—(COOH)_n \qquad (6)$$

In the formula, a reference code $R_1$ denotes an arylene group having 6 to 14 carbon atoms, and reference codes m and n each independently denotes a integer from 1 to 3.

Description will be made below for the compound represented by the general formula (6) shown above. Preferably, the number of carbon atoms of the arylene group denoted by the code $R_1$ is 6 to 14, more preferably, 6 to 10. Concrete examples of the arylene group represented by the code $R_1$ include a phenylene group, a naphtyl group, an anthryl group and a phenathryl group. The arylene group denoted by the code $R_1$ may be substituted for an alkyl group having 1 to 10 carbon atoms, an alkenyl group having 2 to 10 carbon atoms, an alkynyl group having 2 to 10 carbon atoms, an aryl group having 6 to 10 carbon atoms, a carboxylic ester group, an alkoxy group, a phenoxy group, a surfuric ester group, a phosphonic ester group, a sulfonyl amide group, a nitro group, a nitrile group, an amino group, a hydroxy group a halogen atom, an ethylene oxide group, a propylene oxide group, a triethyl ammonium chloride group or the like.

Concrete examples of the compounds represented by the general formula (6) include 3-hydroxybenzoic acid, 4-hydroxybenzoic acid, salicylic acid, 1-hydroxy-2-naphthoic acid, 2-hydroxy-1-naphthoic acid, 2-hydroxy-3-naphthoic acid, 2,4-dihydroxybenzoic acid, and 10-hydroxy-9-anthracenecarboxylic acid. However, the compound is not limited to the above-described concrete examples. Moreover, the compound represented by the general formula (6) may be singly used, or two or more of the compounds may be mixed for use.

The undercoat layer including the foregoing polymer for use in the present invention and the compound represented by the foregoing general formula (6), which is added according to needs, is provided by being coated on the above-described aluminum support by various methods.

As methods for providing the undercoat layer, for example, the following two methods can be enumerated. One is a coating method for providing an undercoat layer. In the method, the polymer for use in the present invention and the compound represented by the general formula (6), which is added according to needs, are dissolved in an organic solvent such as methanol, ethanol and methyl ethyl ketone, a mixed solvent of these organic solvents or a mixed solvent of one or more of these organic solvents and water. The solution obtained in the above-described manner is coated on the aluminum support, and dried. In another method, the polymer for use in the present invention and the compound represented by the general formula (6), which is added according to needs, are dissolved in an organic solvent such as methanol, ethanol and methyl ethyl ketone, a mixed solvent of these organic solvents or a mixed solvent of one or more of these organic solvents and water. Then, the aluminum support is immersed in the solution obtained in the above-described manner, cleaned by water or air, and then dried.

In accordance with the former method, the solution of the foregoing compounds with a concentration of 0.005 to 10 wt % in total can be coated by various methods. For example, any method including bar coater coating, spin coating, spray coating, curtain coating and the like may be used. In the latter method, a concentration of the solution is 0.005 to 20 wt %, preferably, 0.01 to 10 wt %, an immersion temperature is 0 to 70° C., preferably, 5 to 60° C., and an immersion time is 0.1 second to 5 minutes, preferably 0.5 to 120 seconds.

pH of the foregoing solution can be adjusted so that the solution can be used in a pH ranging from 0 to 12, preferably from 0 to 6, with a basic substance such as ammonia, triethylamine, potassium hydroxide, inorganic acid such as hydrochloric acid, phosphoric acid, sulfuric acid and nitric acid, various organic acidic substances including organic sulfonic acid such as nitrobenzene sulfonic acid and naphthalene sulfonic acid, organic phosphonic acid such as phenylphosphonic acid, organic carbonic acid such as benzoic acid, coumalic acid and malic acid, and organic chloride such as naphthalenesulfonyl chloride and benzenesulfonyl chloride.

Moreover, for improving the tone reproduction characteristic of the presensitized plate, a substance absorbing ultraviolet rays, visible light, infrared rays and the like can be also added.

A coating amount of the compound after being dried, which constitutes the undercoat layer of the presensitized plate of the present invention, is suitably 1 to 100 $mg/m^2$, preferably, 2 to 70 $mg/m^2$, in total. When the foregoing coating amount is less than 1 $mg/m^2$, a sufficient effect is not obtained sometimes. A similar case occurs also when the coating amount is more than 100 $mg/m^2$.

<Thermosensitive Layer>

A presensitized plate according to the present invention is provided on a support for a lithographic printing plate, preferably on the aforementioned undercoat layer after it is provided, with a thermosensitive layer. The thermosensitive layer contains a photothermal conversion agent which absorbs infrared rays and generates heat and a water-insoluble and alkali-soluble resin (hereafter also referred to as "an alkali-soluble high-molecular compound"), and which can become alkali-soluble by heating. The thermosensitive layer may be a single layer or a superimposed thermosensitive layer composed of two layers or more. Besides the thermosensitive layer, the presensitized plate may be provided with a layer with functions such as surface protection, oxygen blocking or the like.

Hereafter, details will be explained in <Thermosensitive layer 1> in the case where the thermosensitive layer is composed of a single layer, and details will be explained in <Thermosensitive layer 2> in the case where the thermosensitive layer is a superimposed thermosensitive layer composed of two layers.

<Thermosensitive Layer 1>

A thermosensitive layer 1 used in a presensitized plate according to the present invention is a thermosensitive layer composed of a single layer which can become alkali-soluble by heating. It is preferable that the thermosensitive layer 1 has a structure that solubility to alkali on an aluminum support side is higher than that on a surface side, and it is particularly preferable that the aforementioned constitution is obtained by phase separation after a coating solution of a single composition is coated thereto.

The thermosensitive layer 1 contains a positive working photosensitive composition for infrared laser (hereinafter, simply referred to also as "photosensitive composition").

The positive working photosensitive composition for infrared laser, which is contained in the thermosensitive layer, contains: at least (A) an alkali-soluble high-molecular compound (referred to also as "high-molecular compound insoluble in water and soluble in an alkali aqueous solution" in this specification); and (C) a compound absorbing light to generate heat (referred to also as "infrared absorbent" in this specification); and preferably, further contains (B) a compound lowering solubility of the high-molecular compound in an alkali solution by dissolving the same in the alkali-soluble high-molecular compound and reducing the solubility lowering action by heating; and further, according to needs, contains (D) another component.

(A) Alkali-soluble High-molecular Compound

An alkali-soluble high-molecular compound used in the present invention is not specially limited as long as it is a high-molecular compound that is insoluble in water and soluble in an alkali aqueous solution. A conventional one already known may be used. Since the thermosensitive layer used in the present invention contains an alkali-soluble high-molecular compound, the thermosensitive layer has a characteristic that it is dissolved in an alkali developer if contacting it. It is preferable that a homopolyer, a copolymer of a monomer containing an acidic group in a main chain and/or a side chain in the high-molecular compound, or a mixture of the homopolymer and the copolymer is used as an alkali-soluble high-molecular compound. Specifically, it is preferable that the high-molecular compound contains either of functional group of (1) phenolic hydroxy group, (2) sulfonamide group (—$SO_2$NH—R), and (3) substituted sulfonamide acidic group (—$SO_2$NHCOR, —$SO_2$NH$SO_2$R, —CONH$SO_2$R) (hereafter referred to as "activated imide group") in a molecule. Among them, use of an alkali-soluble high-molecular compound containing (1) a phenolic hydroxy group in its molecule is preferable because of its excellent performance in image formation by infrared laser exposure or the like.

Examples of an alkali-soluble high-molecular compound are as described below, however, an alkali-soluble high-molecular compound used in the present invention is not limited to those.

(A) Alkali-soluble high-Molecular Compound

The alkali-soluble high-molecular compound for use in the present invention is not particularly limited and conventionally well-known one can be employed. Preferably, it is a compound containing, in the molecule, any functional group of (1) phenolic hydroxy group, (2) sulfonamide group and (3) active imide group.

Examples of the high-molecular compounds containing (1) phenolic hydroxy groups include novolac resin and pyrogallol acetone resin such as phenol-formaldehyde resin, m-cresol-formaldehyde resin, p-cresol-formaldehyde resin, m-/p-mixed cresol-formaldehyde resin and phenol/cresol (any of m-, p- and m-/p-) mixed formaldehyde resin.

Besides the above, as the high-molecular compound containing the phenolic hydroxy group, a high-molecular compound containing the phenolic hydroxy group in a side chain thereof can be preferably used. As the high-molecular compound containing the phenolic hydroxy group in the side chain, exemplified is a high-molecular compound obtained by homopolymerizing polymeric monomers made of low-molecular compounds which contains at least one phernolic hydroxy group and at least one polymerizable unsaturated bond or by copolymerizing another polymeric monomer with the concerned monomers.

Examples of the polymeric monomers containing the phenolic hydroxy groups include acrylamide, methacrylamide, acrylic ester, methacrylic ester, which contain the phenolic hydroxy group, and hydroxystyrene. Specifically, the following is preferably used: N-(2-hydroxyphenyl)acrylamide; N-(3-hydroxyphenyl)acrylamide; N-(4-hydroxyphenyl)acrylamide; N-(2-hydroxyphenyl)methacrylamide; N-(3-hydroxyphenyl)methacrylamide; N-(4-hydroxyphenyl)methacrylamide; o-hydroxyphenyl acrylate; m-hydroxyphenyl acrylate; p-hydroxyphenyl acrylate; o-hydroxyphenyl methacrylate; m-hydroxyphenyl methacrylate; p-hydroxyphenyl methacrylate; o-hydroxystyrene; m-hydroxystyrene; p-hydroxystyrene; 2-(2-hydroxyphenyl)ethylacrylate; 2-(3-hydroxyphenyl)ethylacrylate; 2-(4-hydroxyphenyl)ethylacrylate; 2-(2-hydroxyphenyl) ethylmethacrylate; 2-(3-hydroxyphenyl)ethylmethacrylate; 2-(4-hydroxyphenyl)ethylmethacrylate and the like. Such resin containing the phenolic hydroxy group may be used in combination of two types thereof or more.

Moreover, as described in U.S. Pat. No. 4,123,279, a condensed polymer of phenol and formaldehyde containing alkyl groups having 3 to 8 carbon as substituents atoms such as t-butylphenol-formaldehyde resin and octylphenol-formaldehyde resin may be used together.

Examples of the alkali-soluble high-molecular compound containing (2) sulfonamide group include a high-molecular compound obtained by homopolymerizing polymeric monomers containing sulfonamide groups or by copolymerizing another polymeric monomer with the concerned monomers. Examples of the polymeric monomers containing the sulfonamide groups include polymeric monomers made of low-molecular compounds which contains at least one sulfonamide group-NH—$SO_2$ in which at least one hydrogen atom is bonded onto a nitrogen atom and at least one polymerizable unsaturated bond in one molecule. Among them, a low-molecular compound containing any of an acryloyl group, an allyl group and a vinyloxy group and any of a monosubstituted aminosulfonyl group and a substituted sulfonylimino group is preferable. As the compound as described above, for example, enumerated are compounds represented by the following general formulae (I) to (V).

(I)

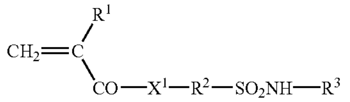

(II)

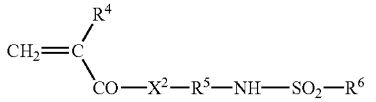

(III)

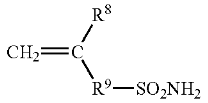

(IV)

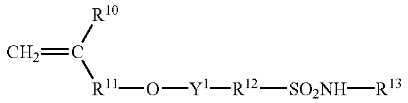

(V)

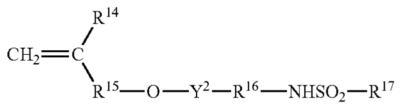

In the formulae, each of reference codes $X^1$ and $X^2$ independently denotes —O— or —$NR_7$—. Each of reference codes $R^1$ and $R^4$ independently denotes a hydrogen atom or —$CH_3$. Each of reference codes $R^2$, $R^5$, $R^9$, $R^{12}$ and $R^{16}$ independently denotes an alkylene group, a cycloalkylene group, an arylene group or an aralkylene group, each of which may contain a substituent and has 1 to 12 carbon atoms. Each of reference codes $R^3$, $R^7$ and $R^{13}$ independently denotes an alkyl group, a cycloalkyl group, an aryl group or an aralkyl group, each of which may contain a hydrogen atom and a substituent and has 1 to 12 carbon atoms. Moreover, each of reference codes $R^6$ and $R^{17}$ independently denotes an alkyl group, a cycloalkyl group, an aryl group or an aralkyl group, each of which may contain a substituent and has 1 to 12 carbon atoms. Each of reference codes $R^8$, $R^{10}$ and $R^{14}$ independently denotes a hydrogen atom or —$CH_3$. Each of reference codes $R^{11}$ and $R^{15}$ independently denotes a single bond or an alkylene group, a cycloalkylene group, an arylene group or an aralkylene group, each of which may contain a substituent and has 1 to 12 carbon atoms. Each of reference codes $Y^1$ and $Y^2$ independently denotes a single bond or —CO—. Specifically, m-aminosulfonylphenyl methacrylate, N-(p-aminosulfonylphenyl)methacrylamide, N-(p-aminosulfonylphenyl) acrylamide and the like can be preferably used.

The alkali-soluble high-molecular compound containing (3) active imide group preferably contains an active imide group represented by the following formula in the molecule. As the high-molecular compound, exemplified is a high-molecular compound obtained by homopolymerizing polymeric monomers made of low-molecular compounds which contains at least one active imide group represented by the following formula and at least one polymerizable unsaturated bond, or by copolymerizing another polymeric monomer with the concerned monomers.

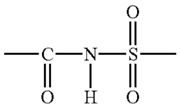

As the compound as described above, specifically, N-(p-toluenesulfonyl)methacrylamide, N-(p-toluenesulfonyl) acrylamide and the like can be preferably used.

Moreover, as preferable alkali-soluble high-molecular compounds for use in the present invention, exemplified are a high-molecular compound obtained by polymerizing two types or more selected from a polymeric monomer containing the above-described phenolic hydroxy groups, a polymeric monomer containing the above-described sulfonamide groups and a polymeric monomer containing the above-described active imide groups, or a high-molecular compound obtained by copolymerizing another polymeric monomer with the concerned two types or more of the polymeric monomers.

In the case where the polymeric monomer containing the phenolic hydroxy group is copolymerized with the polymeric monomer containing the sulfonamide group and/or the polymeric monomer containing the active imide group, a quantity ratio for mixing these components preferably ranges from 50:50 to 5:95, more preferably, ranges from 40:60 to 10:90.

In the case where the alkali-soluble high-molecular compound is a copolymer of a monomer imparting alkali-solubility and another polymeric monomer, the monomer imparting the alkali-solubility including the polymeric monomer containing the above-described phenolic hydroxy group, the polymeric monomer containing the above-described sulfonamide group and the polymeric monomer containing the above-described active imide group, the content of the monomer imparting the alkali solubility is preferably 10 mol % or more, more preferably, 20 mol % or more. When this monomer content is less than 10 mol %, the alkali-solubility tends to be insufficient, and sometimes, an effect of improving a development latitude is not sufficiently achieved.

As the monomer component copolymerized with the polymeric monomer containing the above-described phenolic hydroxy group, the polymeric monomer containing the above-described sulfonamide group and the polymeric monomer containing the above-described active imide group, for example, monomers enumerated in the following (1) to (12) can be used. However, the component is not limited to them.

(1) Acrylic esters and methacrylic esters, each of which contains an aliphatic hydroxy group such as 2-hydroxyethyl acrylate and 2-hydroxyethyl methacrylate.

(2) Alkylacrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethyl acrylate.

(3) Alkyl methacrylates such as methyl methacrylate, ethyl methacrylate, propyl methacrylate, butyl methacrylate, amyl methacrylate, hexyl metahcrylate, cyclohexyl methacrylate, benzyl methacrylate, 2-chloroethyl methacrylate, glycidyl methacrylate and N-dimethylaminoethyl methacrylate.

(4) Acrylamides and methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide and N-ethyl-N-phenyl acrylamide.

(5) Vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether.

(6) Vinyl esters such as vinyl acetate, vinyl chloroacetate, vinyl butylate and vinyl benzoate.

(7) Styrenes such as styrene, α-methylstyrene, methylstyrene and chloromethylstyrene.

(8) Vinyl ketones such as methyl vinyl ketone, ethyl vinyl ketone, propyl vinyl ketone and phenyl vinyl ketone.

(9) Olefin grouping such as ethylene, propylene, isobutylene, butadiene and isoprene.

(10) N-vinylpyrrolidone, N-vinylcarbazole, 4-vinylpyridine, acrylonitrile, methacrylonitrile and the like.

(11) Unsaturated imides such as maleimide, N-acryloylacrylamide, N-acetylmethacrylamide, N-propionylmethacrylamide and N-(p-chlorobenzoyl)methacrylamide.

(12) Unsaturated carboxylic acids such as acrylic acid, methacrylic acid, maleic anhydride and itaconic acid.

In the present invention, in the case where the alkali-soluble high-molecular compound is a homopolymer or copolymer of the polymeric monomer containing the above-described phenolic hydroxy group, the polymeric monomer containing the above-described sulfonamide group or the polymeric monomer containing the above-described active imide group, preferably, a weight-average molecular weight thereof is 2,000 or more, and a number-average molecular weight thereof is 500 or more. More preferably, the weight-average molecular weight ranges from 5,000 to 300,000, and the number-average molecular weight ranges from 800 to 250,000, and, a degree of dispersion thereof (weight-average molecular weight/number-average molecular weight) ranges between 1.1 and 10.

Moreover, in the present invention, in the case where the alkali-soluble high-molecular compound is resin such as phenol formaldehyde resin and cresol aldehyde resin, preferably, the weight-average molecular weight thereof ranges from 500 to 20,000, and the number-average molecular weight thereof ranges from 200 to 10,000.

The alkali-soluble high-molecular compound described above may be singly used, or the compounds may be used in a combination of two or more thereof. The weight percentage of the added alkali-soluble high-molecular compound based on the total solids of the thermosensitive layer preferably ranges from 30 to 99 wt %, more preferably from 40 to 95 wt %, much more preferably from 50 to 90 wt %. When the weight percentage of the added alkali-soluble high-molecular compound is less than 30 wt %, the durability of the thermosensitive layer is deteriorated. And it is not preferable in both of the photosensitivity and the durability that the weight percentage thereof exceeds 99 wt %.

As the alkali-soluble high-molecular compound, novolak resins are preferably exemplified. Novolak resins are not particularly limited and include phenol-formaldehyde resins, m-cresol-formaldehyde resins, p-cresol-formaldehyde resins, m-/p-mixed cresol-formaldehyde resins and phenol/cresol mixed (which may be m-, p-, o-, m-/p-mixed, m-/o-mixed or o-/p-mixed)-formaldehyde resins. They may be used alone or in combination of 2 or more.

In the present invention, the positive working photosensitive composition comprising the above-described novolak resin as a binder is one of the preferred embodiment. However, other high-molecular resins insoluble in water and soluble in an alkali may also be used in this embodiment.

Examples of such resins include phenol modified xylene resins; polyhydroxystyrene and polyhalogenated hydroxystyrene; acrylic resins having phenolic hydroxy groups as described in JP 51-34711 A; acrylic resins having sulfonamido groups as described in JP 2-866 A; and urethane-base resins. As urethane-base resins, preferably exemplified are the ones described in JP 63-124047 A, JP 63-261350 A, JP 63-287942 A, JP 63-287943 A, JP 63-287944 A, JP 63-287946 A, JP 63-287947 A, JP 63-287948 A, JP 63-287949 A, JP 1-134354 A or JP 1-255854 A. They may be used alone or in combination of 2 or more.

As described above, in addition to the novolak resin, other resins may also be used in this embodiment. The novolak resin is preferably 50 wt % or more, more preferably 75 wt % or more of the high-molecular resins insoluble in water and soluble in an alkali. When a content of novolak resin is in the above-described range, an effect of improving press life is very high.

(B) Compound Lowering Solubility of the High-molecular Compound in an Alkali Solution by Dissolving the Same in the Alkali-soluble High-molecular Compound and Reducing the Solubility Lowering Action by Heating (B) component has properties as follows. Specifically, due to the action of the hydrogen-bonding functional group present in the molecule, the solubility of (B) component with (A) alkali-soluble high-molecular compound is good, thus enabling the formation of even coating liquid. Moreover, due to the interaction with (A) component, (B) component can inhibit the alkali-solubility of the concerned high-molecular compound.

Moreover, with regard to (B) compound, the solubility lowering action thereof disappears by heating. However, in the case where (B) component itself is a compound decomposed by heating, when an energy sufficient for the decomposition is not imparted thereto depending on conditions such as a laser output and an irradiation time, there causes a fear of insufficient lowering of the solubility controlling action and lowering of the photosensitivity. Accordingly, the thermal decomposition temperature of (B) component is preferably 150° C. or more.

Examples of preferable (B) compounds for use in the present invention include compounds such as a sulfonic compound, ammonium salt, phosphonium salt and an amide compound, which interact with the above-described (A) component. As described above, (B) component should be appropriately selected in consideration of the interaction with (A) component. Specifically, for example, in the case where the novolak resin is singly used as (A) component, cyanine dye A or the like to be exemplified later is suitably used.

Preferably, the mixing amount ratio of (A) component to (B) component usually ranges from 99/1 to 75/25. In the case where (B) component is contained less than 1%, the interaction with (A) component becomes insufficient, and the alkali solubility cannot be inhibited, thus causing difficulty in forming a good image. Moreover, in the case where (B) component is contained more than 25%, since the interaction is excessive, the photosensitivity is significantly lowered. Both of the above-described cases are not preferable.

(C) Compound Absorbing Light to Generate Heat

The compound absorbing light to generate heat in the present invention is referred to as a compound having a light absorbing band in an infrared ray range of 700 nm or more, preferably 750 to 1200 nm, and having a photothermal conversion function made to emerge in light of a wavelength in the above-described band. Specifically, various pigments and dyes absorbing the light of the above-described wavelengths to generate heat can be used. As the above-described pigments, commercially available pigments or pigments described in "Color Index (C. I.) Handbook", "Latest Pigment Handbook (Saishin Ganryo Binran)" (edited by Japan Association of Pigment Technology, 1977), "Latest Pigment Application Technology (Saishin Ganryo Oyo Gijyutsu)" (CMC, 1986) and "Printing Ink Technology (Insatsu Inki Gijyutsu)" (CMC, 1984) can be used.

Examples of the above-described pigments include a black pigment, an yellow pigment, an orange pigment, a brown pigment, a red pigment, a purple pigment, a blue pigment, a green pigment, a fluorescent pigment, a metal powder pigment and a polymer-bonded dyestuff. Specific examples of the pigments include an insoluble azo pigment, an azo lake pigment, a condensed azo pigment, a chelate azo pigment, a phthalocyanine-based pigment, an anthraquinone-based pigment, a perylene and perinone-based pigment, a thioindigo-based pigment, a quinacridone-based pigment, a dioxazine-based pigment, an isoindolinone-based pigment, a quinophthalone-based pigment, a dyeing lake pigment, an azine pigment, a nitroso pigment, a nitro pigment, a natural pigment, an inorganic pigment and a carbon black.

These pigments may be used without surface treatment or may be used after the surface treatment. Surface treatment methods include a surface coating method with resin and wax, a method of adhering surfactant, a method of bonding a reactive substance (for example, a silane coupling agent, an epoxy compound and polyisocyanate) to a pigment surface. The above-described surface treatment methods are described in "Properties and Applications of Metal Soaps" (Saiwai Shobo Co., Ltd.), "Printing Ink Technology (Insatsu Inki Gijyutsu)" (CMC, 1984) and "Latest Pigment Application Technology (Saishin Ganryo Oyo Gijyutsu)" (CMC, 1986).

A particle diameter of the above-described pigments preferably ranges from 0.01 to 10 μm, more preferably from 0.05 to 1 μm, much more preferably from 0.1 to 1 μm. It is not preferable that the particle diameter of the pigments be less than 0.01 μm in terms of stability of the dispersant in the thermosensitive layer coating liquid. And, it is not preferable that the particle diameter exceeds 10 μm in terms of evenness of the thermosensitive layer.

As a method of dispersing the above-described pigments, a well-known dispersing technology for use in preparing ink, toner and the like can be used. Examples of the dispersing machine include an ultrasonic dispersing machine, a sandmill, an atritor, a pearl mill, a super mill, a ball mill, an impeller, a disperser, a KD mill, a colloid mill, a dynatron, a three-roll mill and a pressurizing kneader. Details thereof are described in "Latest Pigment Application Technology (Saishin Ganryo Oyo Gijyutsu)" (CMC, 1986).

As the above-described dyes, commercially available dyes and well-known dyes described in documents (for example, "Dye Handbook" edited by The Society of Synthetic Organic Chemistry, Japan, 1970) can be used. Specific examples of the dyes include an azo dye, an azo dye in the form of a metallic complex salt, a pyrazolone azo dye, a naphthoquinone dye, an anthraquinone dye, a phthalocyanine dye, a carbonium dye, a quinoneimine dye, a methyne dye, a cyanine dye.

In the present invention, among the above-described pigments and dyes, the ones absorbing infrared rays or near-infrared rays are particularly preferable in that they are suitable for use in a laser emitting the infrared rays or near-infrared rays.

As such pigments absorbing the infrared rays or near-infrared rays, carbon black is preferably used. Moreover, examples of the dyes absorbing the infrared rays or near-infrared rays include the cyanine dye described in JP 58-125246 A, JP 59-84356 A, JP 59-202829 A, JP 60-78787 A and the like, the methyne dye described in JP 58-173696 A, JP 58-181690 A, JP 58-194595 A and the like, the naphthoquinone dye described in JP 58-112793 A, JP 58-224793 A, JP 59-48187 A, JP 59-73996 A, JP 60-52940 A, JP 60-63744 A and the like, the squarylium dyestuff described in JP 58-112792 A and the like, the cyanine dye described in GB 434,875 B and the dihydroperimidine squarylium described in U.S. Pat. No. 5,380,635.

Moreover, as the above-described dye, the near-infrared ray absorbing sensitizer described in U.S. Pat. No. 5,156,938 is also preferably used. Furthermore, more preferably used are the substituted aryl benzo(thio)pyrylium salt described in U.S. Pat. No. 3,881,924, the trimethyne thiopyrylium salt described in JP 57-142645 A (U.S. Pat. No. 4,327,169), the pyrylium series compound described in JP 58-181051 A, JP 58-220143 A, JP 59-41363 A, JP 59-84248 A, JP 59-84249 A, JP 59-146063 A and JP 59-146061 A, the cyanine dyestuff described in JP 59-216146 A, the pentamethyne thiopyrylium salt and the like described in U.S. Pat. No. 4,283,475, the pyrylium compound described in JP 5-13514 B (the term "JP XX-XXXXXX B" as used herein means an "examined Japanese patent publication") and JP 5-19702 B; Epolight III-178, Epolight III-130, Epolight III-125, Epolight IV-62A and the like.

Moreover, as another example of the above-described more preferable dyes, the near-infrared ray absorbing dye represented in the formula (I) or (II) in U.S. Pat. No. 4,756,993 is enumerated.

These pigments or dyes can be added into the above-described photosensitive composition in the following amounts to the total solids of the thermosensitive layer. Specifically, the amount added ranges preferably from 0.01 to 50 wt %, more preferably from 0.01 to 10 wt %. In the case of dye, the amount ranges particularly preferably from 0.5 to 10 wt %. In the case of pigments, the amount ranges particularly preferably from 3.1 to 10 wt %. When an additional amount of the pigment or dye is less than 0.01 wt %, the photosensitivity is lowered. When the additional amount exceeds 50 wt %, the evenness of the thermosensitive layer is lost, and the durability of the thermosensitive layer is deteriorated.

Each of these pigments or dyes may be added into the same layer as that having other components. Alternatively, another layer may be provided, and each of these pigments or dyes may be added thereinto. In the case where another layer is provided, preferably, another layer is provided to be adjacent to the layer containing the substance of the present invention, which has thermal decomposability and substantially lowers the solubility of the alkali-soluble high-molecular compound in an undecomposed state, and the pigment or dye is added thereinto.

Moreover, though the dye or pigment and the alkali-soluble high-molecular compound are preferably included in the same layer, it does not matter if the dye or pigment and the alkali-soluble high-molecular compound are included in layers different from each other.

(B+C) Component

In the present invention, in place of (B) compound lowering solubility of the high-molecular compound in the alkali solution by dissolving the same in the alkali-soluble high-molecular compound and reducing the solubility lowering action by heating and (C) compound absorbing light to generate heat, one compound having properties of the both compounds described above (hereinafter, also referred to as "(B+C) component") can be also made to contain. As such a compound, for example, ones represented by the following general formula (Z) are enumerated.

(Z)

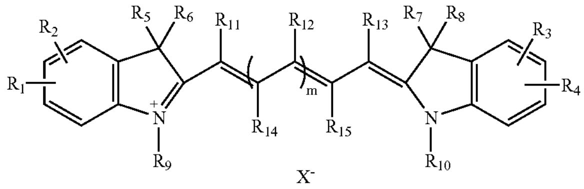

In the above-described general formula (Z), each of reference codes $R_1$ to $R_4$ independently denotes a hydrogen atom or an alkyl group, an alkenyl group, an alkoxy group, a cycloalkyl group or an aryl group, each of which has 1 to 12 carbon atoms and may contain a substituent. $R_1$ and $R_2$, as well as $R_3$ and $R_4$, may be respectively bonded to form a ring structure. Here, specific examples of $R_1$ to $R_4$ include a hydrogen atom, a methyl group, an ethyl group, a phenyl group, a dodecyl group, a naphthyl group, a vinyl group, an aryl group, and a cyclohexyl group. In the case where these groups contain substituents, examples of the substituents include a halogen atom, a carbonyl group, a nitro group, a nitrile group, a sulfonyl group, a carboxy group, carboxylic ester and sulfonic ester.

Each of reference codes $R_5$ to $R_{10}$ independently denotes an alkyl group which has 1 to 12 carbon atoms and may contain a substituent. Here, specific examples of $R_5$ to $R_{10}$ include a methyl group, an ethyl group, a phenyl group, a dodecyl group, a naphtyl group, a vinyl group, an allyl group, and a cyclohexyl group. In the case where these groups contain substituents, examples of the substituents include a halogen atom, a carbonyl group, a nitro group, a nitrile group, a sulfonyl group, a carboxy group, carboxylic ester, and sulfonic ester.

Each of reference codes $R_{11}$ to $R_{13}$ independently denotes an alkyl group which has 1 to 8 carbon atoms and may contain a hydrogen atom, a halogen atom or a substituent. Here, $R_{12}$ may be bonded to $R_{11}$ or $R_{13}$ to form a ring structure. In the case of m>2, a plurality of $R_{12}$ may be bonded to each other to form a ring structure. Specific examples of $R_{11}$ to $R_{13}$ include a chlorine atom, a cyclohexyl group, and cyclopentyl and cyclohexyl rings composed by bonding $R_{12}$ to each other. In the case where these groups contain substituents, examples of the substituents include a halogen atom, a carbonyl group, a nitro group, a nitrile group, a sulfonyl group, a carboxy group, carboxylic ester, and sulfonic ester. Moreover, a reference code m denotes an integer of 1 to 8, preferably 1 to 3.

Each of reference codes $R_{14}$ and $R_{15}$ independently denotes a hydrogen atom, a halogen atom or an alkyl group which has 1 to 8 carbon atoms and may contain a substituent. $R_{14}$ may be bonded to $R_{15}$ to form a ring structure. In the case of m>2, a plurality of $R_{14}$ may be bonded to each other to form a ring structure. Specific examples of $R_{14}$ and $R_{15}$ include a chlorine atom, a cyclohexyl group and cyclopentyl and cyclohexyl rings composed by bonding $R_{14}$ to each other. In the case where these groups contain substituents, examples of the substituents include a halogen atom, a carbonyl group, a nitro group, a nitrile group, a sulfonyl group, a carboxy group, carboxylic acid ester and sulfonic acid ester. Moreover, a reference code m denotes an integer of 1 to 8, preferably 1 to 3.

In the above-described general formula (Z), a reference code $X^-$ denotes anion. Concrete examples of compounds that become anion include perchloric acid, tetrafluoroboric acid, hexafluorophosphoric acid, triisopropyl naphthalene sulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid and paratoluenesulfonic acid. Among them, particularly, hexafluorophosphoric acid, triisopropylnaphthalenesulfonic acid and alkylaromatic sulfonic acid such as 2,5-dimethylbenzenesulfonic acid are preferably used.

The compound represented by the above-described general formula (Z) is a compound generally called cyanine dye. Specifically, compounds to be described below are preferably used. However, the present invention is not limited to these concrete examples.

CYANINE DYE A

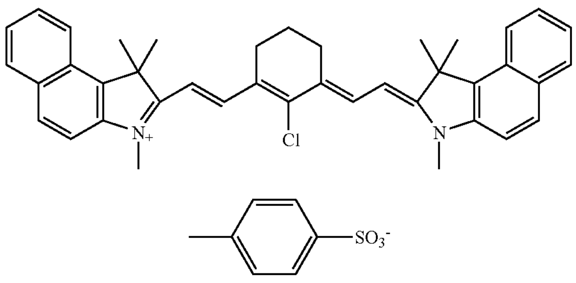

CYANINE DYE B

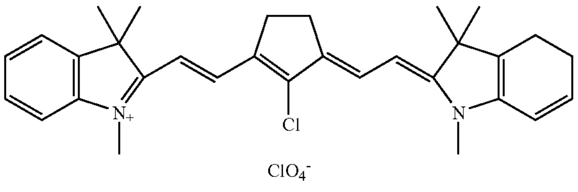

-continued

CYANINE DYE C

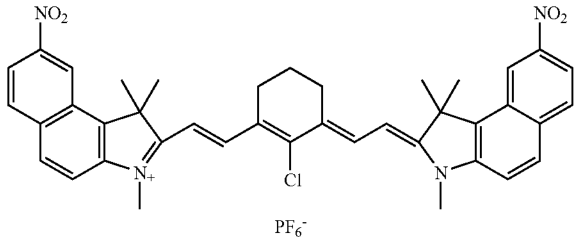

CYANINE DYE D

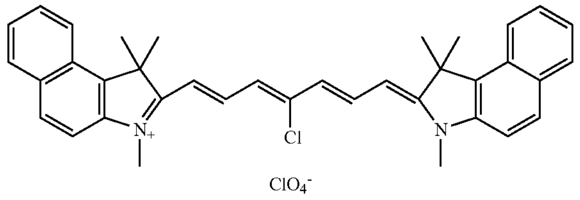

CYANINE DYE E

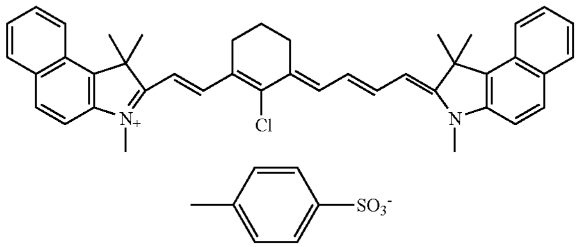

The above described (B+C) component has a property to absorb light to generate heat (that is, property of (c) component). Moreover, the (B+C) component has a light absorbing band in the infrared region from 700 to 1,200 nm. Furthermore, the (B+C) component is good in compatibility with the alkali-soluble high-molecular compound, is basic dye, and contains, in a molecule, a group interacting on the alkali-soluble high-molecular compound containing an ammonium group and an iminium group (that is, has a property of (B) component). Accordingly, the (B+C) component can interact with the concerned high-molecular compound to control the alkali-solubility thereof, thus being preferably usable for the present invention.

In the present invention, in the case where the (B+C) component such as the above-described cyanine dye having the both properties of (B) component and (C) component is used in place of the same, the amount ratio of this compound to (A) component preferably ranges from 99/1 to 70/30 in terms of the photosensitivity, more preferably ranges from 99/1 to 75/25.

(D) Other Components

The thermosensitive layer, in addition to the aforementioned essential components, may contain various additives as necessary, as long as the object of the present invention is not impaired. Hereafter, details will be explained by citing the samples of additives.

For example, it is preferable to use together a substance which is thermally decomposed and substantially reduces solubility of the alkali-soluble high-molecular compound when not decomposed, since such a substance improves inhibitory function of dissolution into a developer in the image areas. Examples of such substances are onium salts, quinone dyazides, aromatic sulfonated compounds and aromatic sulfonic acid ester compound.

For onium salts, diazonium salts, ammonium salts, phosphonium salts, iodonium salts, sulfonium salts, selenonium salts and arsonium salts are cited, for example.

Among them, preferable substances cited, for example, are diazonium salts described in S. I. Schlesinger, Photogr. Sci. Eng., 18, 387 (1974), T. S. Bal et al, Polymer, 21, 423 (1980), and JP 5-158230 A; ammonium salts described in U.S. Pat. Nos. 4,069,055, 4,069,056, and JP 3-140140 A; phosphonium salts described in D. C. Necker et al, Macromolecules, 17, 2468 (1984), C. S. Wen et al, The, Proc. Conf. Rad. Curing ASIA, p. 478, Tokyo, October (1988), U.S. Pat. Nos. 4,069,055, and 4,069,056; iodonium salts described in J. V. Crivello et al, Macromorecules, 10 (6), 1307 (1977), Chem & amp Eng. News, 28, p. 31 (1988), EP 104,143 B, U.S. Pat. Nos. 339,049, 410,201, JP 2-150848 A, and JP 2-296514 A; sulfonium salts described in J. V. Crivello et al, Polymer J. 17, 73 (1985), J. V. Crivello et al, J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromolecules, 14(5), 1141 (1981), J. V. Crivello et al, Macromorecules, 14(5), 1141(1981), J. V. Crivello et al, J. Polymer Sci., Polymer Chem. Ed., 17, 2877 (1979), EP 370,693 B, EP 233,567 B, EP 297,443 B, EP 297,442 B, U.S. Pat. Nos. 4,933,377, 3,902,114, 410,201, 339,049, 4,760,013, 4,734,444, 2,833,827, DE 2,904,626 B, DE 3,604,580 B, and DE 3,604,581 B; selenonium salts described in J. V. Crivello et al, Macromorecules, 10(6), 1307(1977) and J. V. Crivello et al, J. Polymer Sci., Polymer Chem. Ed., 17, 1047 (1979); and arsonium salts described in C. S. Wen et al, Teh, Proc. Conf. Rad. Curing ASIA, p478, Tokyo, Oct (1988).

Among onium salts, diazonium salts are particularly preferable. Also, the particularly preferable diazonium salts are the ones described in JP 5-158230 A.

As a counter ion of onium salts, cited for example are tetrafluoroboric acid, hexafluorophosphoric acid, triisopropylnaphthalenesulphonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzensulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and p-toluenesulfonic acid. Among them, hexafluorophosphoric acid and alkyl aromatic sulfonic acids such as triisopropylnaphthalenesulphonic acid or 2,5-dimethylbenzenesulfonic acid are preferable.

As quinone dyazides, o-quinone dyazide compound is preferrable.

An o-quinone dyazide compound used in the present invention has at least one o-quinone dyazide group, and increases alkali-solubility by thermal decomposition. Compounds with various chemical structures may be used. The o-quinone dyazide compound deprives a binding agent of solubility inhibitory function by thermal decomposition, and the o-quinone dyazide compound itself changes to an alkali-soluble substance. These two effects mutually help enhance solubility of thermosensitive materials.

The compounds described on p.339 to 352 in "Light-sensitive systems" authored by J. Kosar (published by John Wiley & amp; Sons. Inc.) may be, for example, employed as an o-quinone dyazide compound used in the present invention. Particularly, sulfonic acid ester or sulfonic acid amide of o-quinone dyazide compound which is caused to react with various aromatic polyhydroxy compounds or aromatic amino compounds is preferable. Also, the ester of benzoquinone (1,2)-dyazidesulfonic acid chloride or naphthoquinone-(1,2)-dyazide-5-sulfonic acid chloride and pyrogallol-acetone resin as described in JP 43-28403 B, the ester of benzoquinone-(1,2)-dyazidesulfonic acid chloride or naphthoquinone-(1,2)-dyazide-5-sufonic acid chloride and phenol-formaldehyde resin are preferably utilized.

In addition, preferably used as well are the ester of naphthoquinone-(1,2)-dyazide-4-sufonic acid chloride and phenol-formaldehyde resin or cresol-formaldehyde resin, the ester of naphthoquinone-(1,2)-dyazide-4-sufonic acid chloride and pyrogallol-acetone resin. Beside the foregoing, useful o-quinoneazide compounds are reported in many patents and are known. For example, cited are the compounds described in JP 47-5303 A, JP 48-63802 A, JP 48-63803 A, JP 48-96575 A, JP 49-38701 A, JP 48-13354 A, JP 41-11222 B, JP 45-9610 B, JP 49-17481 B, U.S. Pat. Nos. 2,797,213, 3,454,400, 3,544,323, 3,573,917, 3,674,495, 3,785,825, GB 1,227,602 B, GB 1,251,345 B, GB 1,267,005 B specification, GB 1,329,888 B, GB 1,330,932 B, and DE 854,890 B.

Added amount of each of onium salts and o-quinoneazide compounds is preferably 1 to 50 wt %, more preferably 5 to 30 wt %, and particularly preferably 10 to 30 wt % to the total solid content of a layer to be added. A single compound or a mixture of two or more types of the compounds may be used.

An added amount of additive other than onium salts and o-quinoneazide compounds is preferably 1 to 50 wt %, more preferably 5 to 30 wt %, and particularly preferably 10 to 30 wt % to the total solid content of a layer to be added. In the present invention, it is preferable that an additive and an alkali-soluble high-molecular compound are contained in the same layer.

Further, it is preferable that the thermosensitive layer should contain a polymer composed as a polymerized component of (meta) acrylate monomers having two or three perfluoroalkyl groups with the number of carbon of 3 to 20 in a molecule thereof as described in JP 2000-187318 A, in order to strengthen resistance to discrimination on an image or surface damage resistance.

The added amount of such polymers is preferably 0.1 to 10 wt % and more preferably 0.5 to 5 wt % to the total solid content of a layer to be added.

Further, the thermosensitive layer may contain a compound which reduces coefficient of static friction on the surface of the layer in order to give damage resistance. Cited as such compounds are, for example, the ester of long-chain alkyl carboxylic acids as described in U.S. Pat. No. 6,117,913.

The added amount of such a compound is preferably 0.1 to 10 wt % and more preferably 0.5 to 5 wt % to the total solid content of a layer to be added.

In addition, the thermosensitive layer may contain a compound having an acidic group of a low molecular weight as necessary. Cited as acidic groups are, for example, sulfonic acid group, carboxy group and phosphate group. Among them, a compound containing sulfonic acid group is preferable. Specifically, aromatic sulfonic acids such as p-toluenesufonic acid or naphthalenesulfonic acid and aliphatic sulfonic acids are enumerated.

An added amount of such a compound is preferably 0.05 to 5 wt % and more preferably 0.1 to 3 wt % to the total solid content of a layer to be added. If an amount exceeds 5 wt %, it is not preferable since the solubility of each layer to a developer may be increased.

In addition, the thermosensitive layer may contain various solubility inhibitors in order to adjust solubility of each layer. Preferably used as solubility inhibitors are disulfone compounds or sulfone compounds as described in JP 11-119418 A. Specifically, 4,4'-bishydroxyphenylsulfone is preferably exemplified.

An added amount of a solubility inhibitor is preferably 0.05 to 20 wt % and more preferably 0.5 to 10 wt % to the total solid content of a layer to be added.

Further, for the purpose of increasing the sensitivity, the thermosensitive layer can comprise cyclic acid anhydrides, phenols, organic acids or sulfonyl compounds.

Examples of the cyclic acid anhydrides include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride, which are described in U.S. Pat. No. 4,115,128.

Examples of the phenols include bisphenol A, p-nitrophenol, p-ethoxyphenol, 2,4,4'-trihydroxy benzophenone, 2,3,4-trihydroxy benzophenone, 4-hydroxy benzopenone, 4,4',4"-trihydroxy triphenylmethane, 4,4',3",4""-tetrahydroxy-3,5,3',5'-tetramethyl triphenylmethane.

Examples of the organic acids include sulfonic acids, sulfinic acids, alkyl sulfuric acids, phosphonic acids, phosphoric esters and carboxylic acids, which are describe in JP 60-88942 A and JP 2-96755 A. Specific examples include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxy benzoic acid, phthalic acid, terephtalic acid, 4-cyclohexene-1,2-dicarboxylic acid, erucic acid, lauric acid, n-undecanoic acid and ascorbic acid.

Examples of the sulfonyl compounds include bis(hydroxyphenyl)sulfone, methyl phenyl sulfone and diphenyl disulfone.

Amounts of the foregoing cyclic acid anhydride, phenols, organic acid groups and sulfonyl compounds in the total solids of the above-described photosensitive composition preferably ranges from 0.05 to 20 wt %, more preferably from 0.1 to 15 wt %, particularly preferably from 0.1 to 10 wt %.

Moreover, for the purpose of increasing treatment stability to the developing conditions, the thermosensitive layer can comprise nonionic surfactants as described in JP 62-251740 A and JP 3-208514 A, amphoteric surfactants as described in JP 59-121044 A and JP 4-13149 A, siloxane-based compounds as described in EP 950,517 A and copolymer of a monomer containing fluorine as described in JP 11-288093 A.

Concrete examples of the nonionic surfactant include sorbitan tristearate, sorbitan monopalmitate, sorbitan triolate, stearic acid monoglyceride and polyoxyethylene nonylphenyl ether.

Concrete examples of the amphoteric surfactant include alkyldi(aminoethyl)gilycin, alkyl polyaminoethyl glycin hydrochloride, 2-alkyl-N-carboxyethyl-N-hydroxyethyl imidazolinium betaine and N-tetradecyl-N,N-betaine type (for example, article name "Amogen K", made by Dai-ichi Kogyo Co., Ltd.).

As the siloxane-based compound, block copolymer of dimethyl siloxane and polyalkylene oxide is preferred. Concrete examples include silicone resins modified with polyalkylene oxide such as DBE-224, DBE-621, DBE-712, DBP-732 and DBP-534 produced by Chissso Corporation, Tego Glide 100 produced by Tego (Germany) or the like.

The amount of addition of each of the foregoing nonionic surfactant, the amphoteric surfactant and the siloxane-based compound preferably ranges from 0.05 to 15 wt %, more preferably 0.1 to 5 wt % to the total solids of the layer which they added into.

Moreover, the thermosensitive layer can comprise a printing out agent for obtaining a visible image immediately after heating by exposure, as well as the dye or the pigment as an image coloring agent.

As printing out agent, combination of a compound releasing acid by heating by exposure (photo-acid releasing agent) and an organic dye capable of forming salt is exemplified. Specifically, enumerated are combination of o-naphthoquinone diazide-4-sulfonic acid halogenide and salt-forming organic dye, which are described in JP 50-36209 A and JP 53-8128 A and combination of a trihalomethyl compound and a salt-forming organic dye, which are described in JP 53-36223 A, JP 54-74728 A, JP 60-3626 A, JP 61-143748 A, JP 61-151644 A and JP 63-58440 A. As such trihalomethyl compound, there are a oxazole series compound and a triazine series compound, both of which exhibit storability, and produce a clear printed out image.

As image coloring agent, dyes other than the above-described salt-forming organic dye can be used. As preferable dyes, an oil soluble dye and a basic dye including the salt-forming organic dye can be cited. Specific examples include oil yellow #101, oil yellow #103, oil pink #312, oil green BG, oil blue BOS, oil blue #603, oil black BY, oil black BS, and oil black T-505 (these are all made by Orient Chemical Industries Ltd.), Victorian pure blue, crystal violet (C. I. 42555), methyl violet (C. I. 42535), ethyl violet, Rhodamine B (C. I. 145170B), malachite green (C. I. 42000) and methylene blue (C. I. 52015). Particularly preferable dyes are those described in JP 62-293247 A and JP 5-313359 A.

The amount of addition of the above dyes preferably at the rate of 0.01 to 10 wt %, more preferably at the rate of 0.1 to 3 wt % to the total solids of the layer which they added into.

As occasion demands, the thermosensitive layer can comprise plasticizer for the purpose of providing a coating layer with flexibility. Examples include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and acrylic or methacrylic acid oligomer or polymer.

Further, as occasion demands, the thermosensitive layer can comprise photodegradable compounds such as quinone diazides, diazo compounds or the like. The amount of addition of these compounds preferably be set in the range of 1 to 5 wt % to the total solids of the layer which they added into.

The thermosensitive layer can be prepared typically by dissolving each of the above components in a solvent, and coating it over the aluminum support. For the solvent to be used in this case, for example, one can be selected from ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethyl acetamide, N,N-dimethyl formamide, tetramethyl urea, N-methylpyrrolidone, dimethyl sulfoxide, sulfolane, γ-butyrolactone and toluene. However, the solvent is not limited to these examples, and these solvents can be used either alone or in mixture.

The concentration of the above components in the solvent (all solid contents including additives) should preferably be set in the range of 1 to 50 wt %.

Also, the amount of the thermosensitive layer coating (solid content) on the support obtained after coating and drying should preferably be set in the range of generally 0.5 to 5.0 $g/m^2$.

Various methods are available for coating. For example, one may be selected from bar coater coating, rotational coating, spray coating, curtain coating, dip coating, air knife coating, blade coating, and roll coating.

The thermosensitive layer can comprise surfactant for the purpose of improving coating performance. For example, fluorine-containing surfactant described in JP 62-170950 A can be used. The preferable amount of addition is in the range of 0.01 to 1 wt %, and more preferably in the range of 0.05 to 0.5 wt % to the total solids of the layer which they added into.

<Thermosensitive Layer 2>

A thermosensitive layer 2 used in the presensitized plate according to the present invention is a superimposed thermosensitive layer composed of two layers that can become alkali-soluble by heating. Specifically, cited is a superimposed thermosensitive layer having two layers, that are one thermosensitive layer provided at a position closer to the surface of the presensitized plate (exposure side) and a lower layer provided on a side closer to the support. If the superimposed thermosensitive layer like this is provided, it is possible to separately provide an alkali-soluble layer and a surface slightly soluble layer. This allows a larger discrimination to be obtained, that is, excellent development performance to be achieved. Moreover, damage resistance (less likeliness to scratch) may become excellent. This is because profile irregularities of an aluminum support are absorbed, and a relatively flat surface is formed by providing a lower layer on the support first, and a more flat thermosensitive layer surface is formed by further superimposing a thermosensitive layer on the lower layer.

Both of the lower layer and the thermosensitive layer contain a water-insoluble and alkali-soluble resin. Further, the thermosensitive layer on the lower layer also contains a photothermal conversion agent that absorbs infrared rays and generates heat.

In the present invention, a similar compound that is used in thermosensitive layer 1 may be used as an alkali-soluble high-molecular compound used for the lower layer and the thermosensitive layer. Since the lower layer and the thermosensitive layer used in the present invention contain the alkali-soluble high-molecular compound, the layers have characteristics that they are dissolved when they contact an alkali developer.

An acrylic resin is preferably used as an alkali-soluble high-molecular compound used for the lower layer. If the lower layer contains an acrylic resin as the alkali-soluble high-molecular compound, solubility of the lower layer to an alkali developer composed of the main components of an organic compound having a buffer action and a base may be well maintained. Therefore, image formation performance at the time of development is excellent. Among them, an acrylic resin having sulfonamide group is particularly preferable.

In addition, a high-molecular compound having phenolic hydroxy group is preferable as an alkali-soluble high-molecular compound used in a thermosensitive layer. If the thermosensitive layer contains a high-molecular compound having phenolic hydroxy group as an alkali-soluble high-molecular compound, strong hydrogen bonding is generated in unexposed areas while a part of hydrogen bonding is easily dissolved in exposed areas. In addition, there is a significant difference in development performance between the unexposed areas and the exposed areas to a non-silicate developer. For these reasons, image formation performance at the time of development is excellent. Among them, novolac resin is particularly preferable.

These alkali-soluble high-molecular compounds may be individually used or may be used in combination of two kinds or more.

An added amount of an alkali-soluble high-molecular compound is preferably 30 to 99 wt %, more preferably 40 to 95 wt %, and particularly preferably 50 to 90 wt % to the total solid content of the thermosensitive layer. If an added amount of the alkali-soluble high-molecular compound is less than 30 wt %, the durability of the thermosensitive layer deteriorates. On the other hand, it is not preferable in both sensitivity and durability if an added amount exceeds 99 wt %.

In addition, an added amount of the alkali-soluble high-molecular compound is preferably 50 to 99 wt %, more preferably 60 to 95 wt %, and particularly preferably 70 to 95 wt % to the total solid content of the lower layer. If an added amount of the alkali-soluble high-molecular compound is less than 50 wt %, the durability of the lower layer deteriorates and it is not preferable in both sensitivity and durability if an added amount exceeds 99 wt %.

In the present invention, as a photothermal conversion agent used in the thermosensitive layer that absorbs infrared rays and generates heat, cited is one similar to that used in thermosensitive layer 1.

These photothermal conversion agents may be added not only to the thermosensitive layer but also to the lower layer. Addition of the photothermal conversion agent to the lower layer allows the lower layer also to function as a thermosensitive layer. If a photothermal conversion agent is added to the lower layer, the same agent as in the upper thermosensitive layer may be used or a different one may be used.

In addition, these photothermal conversion agents may be added to the same layer of the other components, or a separate layer may be provided to which the agent may be added. If a separate layer is provided, it is desirable that the agent is added to a layer adjacent to the thermosensitive layer. It is also preferable that a dye and the aforementioned alkali-soluble resin are contained in the same layer. However, they may be contained in different layers.

The agent may be added to layers in the ratios of 0.01 to 50 wt %, preferably 0.1 to 10 wt %, and particularly preferably 0.5 to 10 wt % to the total solid content of all layers. If an added amount of the dye is less than 0.01 wt %, sensitivity thereof decreases, and if the added amount exceeds 50 wt %, uniformity of the thermosensitive layer is lost, thereby deteriorating durability of the thermosensitive layer.

The lower layer and the thermosensitive layer may, besides the above-mentioned essential components, contain various additives as necessary as long as the object of the present invention is not impaired. An additive may be contained in only the lower layer or in both layers.

Concrete examples and added amount of the additives are basically identical to those in the thermosensitive layer 1, and the following are further referred to.

A polymer composed of a polymerized component of (meta) acrylate monomers having two or three perfluoroalkyl groups with the number of carbons of 3 to 20 in the molecule and a compound that decreases coefficient of static friction on a surface of the layer may preferably be contained in either of the lower layer and the thermosensitive layer. However, if they are contained in the thermosensitive layer positioned at an upper area, they are more effective.

After the lower layer is coated on the support, the thermosensitive layer as an upper layer is coated adjacent thereto. In this case, if a solvent that may dissolve an alkali-soluble high-molecular compound in the lower layer is used as a coating solvent of the upper layer, a mixing at an interface between layers may not become negligible, and in an extreme case, a superimposed layer may not be formed and instead a homogeneous single layer may be formed. Thus, if a mixing at an interface between two layers adjacent to each other occurs or the two layers mutually dissolved to show a behavior as if they were a homogeneous layer, it is not preferable since the effect of the presensitized plate according to the present invention characterized by having two layers may be possibly impaired. For this reason, a solvent used for coating a thermosensitive layer is preferably a solvent, which may hardly solve an alkali-soluble high-molecular compound contained in the lower layer.

The concentrations of the above components (the total solid content including additives) in a solvent when coating each layer is preferably 1 to 50 wt %.

In addition, an coating amount (solid content) of the lower layer and the thermosensitive layer on the support obtained after coated and dried, though it varies depending on applications, is preferably 0.05 to 1.0 $g/m^2$ on the thermosensitive layer and 0.3 to 3.0 $g/m^2$ on the lower layer. If a coating amount on the thermosensitive layer is less than 0.05 $g/m^2$, image formation performance may deteriorate and if the coating amount exceeds 1.0 $g/m^2$, sensitivity may possibly deteriorate. In addition, if a coating amount on the lower layer is less than 0.3 $g/m^2$ or exceeds 3.0 $g/m^2$, image formation performance tends to deteriorate in either case.

In addition, it is preferable that a coating amount of the lower layer and the thermosensitive layer is 0.5 to 3.0 $g/m^2$ in total. If the sum of the amounts of the two layers is less than 0.5 $g/m^2$, film characteristics may deteriorate, and if the sum of the amounts exceeds 3.0 $g/m^2$, sensitivity tends to deteriorate. As the coating amount decreases, an apparent sensitivity becomes larger while film characteristics of a thermosensitive film deteriorates.

<Exposure and Developing Method>

A lithographic printing plate is prepared by allowing a presensitized plate of the present invention to be performed various processing methods corresponding to different thermosensitive layers. It is, however, preferable that the lithographic printing plate is prepared by a developing method using a developer containing substantially no alkali metal silicates. That is, it is preferable that a presensitized plate according to the present invention is one to be processed by a developer containing substantially no alkali metal silicates. Furthermore, this method is described in JP 11-109637 A, and the descriptions as stated in JP 11-109637 A may be used in the present invention.

1) Exposure

In the present invention, an exposure of image is conducted before development. As a light source of activating light used for an exposure of image, cited for example are carbon arc lamp, mercury lamp, metal halide lamp, xenon lamp, tungsten lamp and chemical lamp. As a radiation, cited for example are electron beam, X-rays, ion beam, far infrared rays, g-rays, i-rays, Deep-UV rays and high-energy density energy beam (laser beam). As a laser beam, cited for example are helium-neon laser (He—Ne laser), argon laser, krypton laser, helium-cadmium laser, KrF excimer laser, semiconductor laser and YAG laser. It is preferable that the presinsitized plate according to the present invention is exposed by using a light source with an emission wavelength in an area from near infrared rays to infrared rays, and solid laser and semiconductor laser are particularly preferable.

2) Development

As a developer and a replenisher used for development of a presensitized plate according to the present invention, alkali aqueous solutions already known in public domain may be used.

Cited for example are inorganic alkali agents such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide.

In addition, organic alkali agents such as monomethylamine, dimethylamine, trimethylamine, monoethylamine, diethylamine, triethylamine, monoisopropylamine, diisoproprylamine, triisopropylamine, n-buthylamine, monoethanolamine, diethanolamine, triethanolamine, monoisopropanolamine, diisopropanolamine, ethyleneimine, ethylenediamine and pyridine may be used.

These alkali agents may be individually used or may be used as a mixture of two kinds or more.

As particularly preferable developers among these alkali aqueous solutions, cited are aqueous solutions of silicate such as sodium silicate and potassium silicate. This is because development performance may be possibly adjusted by the ratio and concentration of silicon dioxide ($SiO_2$) and alkali metal oxide ($M_2O$) which are the components of silicate. Specifically, for example, alkali metal silicates as described in JP 54-62004 A and JP 57-7427 B are effectively used.

In addition, a developer containing substantially no alkali metal silicates (hereinafter referred to as a "non-silicate developer") is preferably used. Here, "containing substantially no alkali metal silicates" means allowing the developer to contain a trace of alkali metal silicates as incidental impurities and by-products.

A developer containing substantially no alkali metal silicates is not specifically limited, but it is preferable that the developer is an alkali aqueous solution containing substantially no organic solvents. Note that, however, it may contain an organic solvent as necessary.

As a non-silicate developer, an alkali developer mainly composed of an organic compound having a buffer action and a base may be used.

As organic compounds having a buffer action, cited for example are saccharides described as compounds having a buffer action in JP 8-220775 A (particularly, those expressed by general formula (I) or (II)), oximes (particularly, those expressed by general formula (III)), phenols (particularly, those expressed by general formula (IV)) and flourinated alcohols (particularly, those expressed by general formula (V)). Among them, saccharides expressed by general formula (I) or (II) and phenols expressed by general formula (TV) are preferable, and non-reducing sugars such as saccharoses out of saccharides expressed by general formula (I) or (II) and sulfosalicylic acid out of phenols expressed by general formula (IV) are more preferable.

A non-reducing sugar has no free aldehyde group or ketone group and no reducing property and is classified into trehalose type oligosaccharide where reducing groups are combined with each other, and glycosides where a reducing group of saccharide and non-saccharide are combined with each other, and sugar alcohols where saccharide are reduced by hydrogenation. In the development of the presensitized plate according to the present invention, either of them is preferably used.

As trehalose type oligosaccharide, cited for example are saccharose and trehalose. As glycoside, cited for example are alkylglycosides, phenolglycoside and mustard oil glycoside. As sugar alcohols, cited for example are D,L-arabite, xylite, D,L-sorbite, D,L-mannite, D,L-idite, D,L-tarite, zursite and allozyrsite. Moreover, maltitol obtained by hydrogenation of maltose that is a disaccharide, a reductant (reduced starch syrup) obtained by hydrogenation of oligosaccharide or the like is preferably cited.

Among these non-reducing sugars, trehalose type oligosaccharide and sugar alcohol are preferable. D-sorbite, saccharose and reduced starch syrup are particularly preferable since they have a buffer action in a proper pH area and their prices are low.

These non-reducing sugars may be individually used or combination of two kinds or more may be used.

The amount of a non-reducing sugar contained in a non-silicate developer is preferably 0.1 to 30 wt %, and more preferably 1 to 20 wt %. If the content is less than 0.1 wt %, a sufficient buffer action may not be obtained. If the content exceeds 30 wt %, it becomes difficult for the non-reducing sugar to be highly concentrated and its cost becomes high.

As bases, alkali agents already known in the public domain, for example, an inorganic alkali agent or an organic alkali agent may be suitably selected and combined with the aforementioned organic compound having buffer action.

As inorganic alkali agents, cited for example are sodium hydroxide, potassium hydroxide, lithium hydroxide, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate. In addition, potassium citrate, potassium tertiary citrate, sodium citrate may be used in the same manner as in the above inorganic alkali agents.

As organic alkali agents, cited for example are monomethylamine, dimethylamine, trimethylamine, monoethylamine, diethylamine, triethylamine, monoisopropylamine, diisoproprylamine, triisopropylamine, n-buthylamine, monoethanolamine, diethanolamine, triethanolamine, monoisopropanolamine, diisopropanolamine, ethyleneimine, ethylenediamine and pyridine.

For base, only one kind may be used or combination of two kinds or more may be used.

Among these bases, sodium hydroxide and potassium hydroxide are preferable. This is because it is possible to adjust pH in a wider pH range by controlling these amounts. In addition, sodium tertiary phosphate, potassium tertiary phosphate, sodium carbonate, and potassium carbonate or the like are preferable since these agents themselves have a buffer action.

As this non-silicate developer, specifically, cited preferably for example is a developer mainly composed of at least one compound selected from non-reducing sugars and at least one kind of base, with a pH range of 9.0 to 13.5. With a non-silicate developer, a pH range of 12.5 to 13.5 is preferable in terms of development performance.

If these non-silicate developers are used, generation of scratching may be suppressed to obtain an excellent lithographic printing plate with image areas free from defects.

It is known that if development is performed by using an automatic processor, a number of presensitized plates may be processed without replacing a developer in a developing tank for a long time by adding an aqueous water (a replenisher) with a higher alkalinity than that of the developer to the developer. This replenishing system is preferably applied to a presensitized plate according to the present invention.

Various surfactants and organic solvents may be added to a developer and a replenisher in order to promote or suppress development performance, disperse development scum, enhance ink receptivity over image areas or the like as necessary. As surfactants, various surfactants of anionic, cationic and nonionic surfactants or amphoteric surfactants may be used.

Moreover, a developer and replenisher may contain reducing agents such as sodium salts and potassium salts of inorganic acids such as hydroquinone, resorcin, sulfurous acid, hydrogensulfurous acid or the like in order to prevent scum or stain over a lithographic printing plate as necessary. In addition, organic carboxylic acid, antiformer, water softener, various developing stabilizers or the like may be added to a developer and replenisher as necessary.

It is preferable that a lithographic printing plate obtained by development using the above developer and replenisher should be subjected to a posttreatment with a rinse containing washing water, surfactant or the like; a desensitizer containing gum arabic, a starch derivative or the like. For these posttreatments, various combinations may be used.

Recently, an automatic processor for a lithographic printing plate is widely used to streamline and standardize plate making in the plate making and printing industry. This automatic processor is generally constituted by a developing section and a posttreatment section, and provided with a device for transferring lithographic printing plates, various processing tanks and a spraying device. The automatic processor performs development by insufflating various processing liquids pumped up from a spray nozzle while horizontally transferring presensitized plates after exposed. Recently, there is known a method that lithographic printing plates are soaked and transferred with in-solution guide rollers or the like in the processing liquid tank filled with the processing liquid. In an automatic processing like this, processing may be performed while feeding replenishers to each processing liquid corresponding to each processing amount, operating time or the like. Also, processing with substantially unused processing liquids, i.e., disposable processing system may be applied.

If there is an unnecessary image area (for example, film edge trace of the original film) left in a lithographic printing plate obtained by performing one or more of water washing, rinsing and gumming as necessary, after exposing an image and developing of a presensitized plate according to the present invention, the unnecessary image area may be erased. It is preferable that an erasing liquid is coated to the unnecessary image area, and then erased by water washing after it is left to stand for a predetermined time as described in JP 2-13293 B, for example. There may be used a method that a development is performed after an activating beam guided by an optical fiber is irradiated to the unnecessary image area as described in JP 59-174842 A.

The lithographic printing plate obtained by the aforementioned treatments may be fed to a printing process after a desensitized gum is coated to the plate if desired. It is preferable that burning-in processing is performed to the lithographic plating plate for further improving press life.

If burning-in processing is performed on a lithographic printing plate, it is preferable that the plate is processed by the surface adjusting liquids as described in JP 61-2518 B, JP 55-28062 B, JP 62-31859 A and JP 61-159655 A. Cited as processing methods by a surface adjusting liquid are, for example, a method that a surface adjusting liquid is coated onto a lithographic printing plate by using the above surface adjusting liquid impregnated sponge or absorbent cotton, a method that a surface adjusting liquid is coated onto a lithographic printing plate soaked in a butt filled with a surface adjusting liquid, and a method that a adjusting liquid is coated by an automatic coater. In addition, the thickness of a coating amount is leveled on the surface of a plate with a squeegee or squeegee roller after the surface adjusting liquid is coated.

It is proper that the coating amount of a surface adjusting liquid is generally 0.03 to 0.8 g/$m^2$ in the mass after dried. The lithographic printing plate after a surface adjusting liquid is coated thereto, after being dried as necessary, is heated to a high temperature by a burning processor (for example, BP-1300 made by Fuji Photo Film Co., Ltd.) or the like. In this case, it is preferable that the heating temperature and time are within the ranges of 180 to 300° C. and 1 to 20 minutes, respectively, although they vary depending on kinds of components that form the image.

Burning-in processing is performed by heating a lithographic printing plate normally at 200° C. or higher, preferably at about 240 to 270° C. for 1 to 20 minutes, although the conditions vary depending on usage.

For a presensitized plate according to the present invention, it is preferable to perform burning-in processing on a lithographic printing plate obtained by development, because this greatly improves press life.

Conventional treatment such as water washing and gumming may be suitably performed, as necessary, on a lithographic printing plate after burning-in processing. If treatment is performed by a surface adjusting liquid containing a water-soluble high-molecular compound or the like before burning-in processing, a so-called desensitizing processing such as gumming may be omitted.

Lithographic printing plates obtained by these treatment are fed to an off-set printing machine or the like and are used for a large number of printing.

EXAMPLES

The following examples are provided for the purpose of further illustrating the present invention but are in no way to be taken as limiting.

1. Preparation of Presensitized Plates

Example 1

Molten metal was prepared by using an aluminum alloy containing Si:0.06 wt %, Fe:0.30 wt %, Cu:0.005 wt %, Mn:0.001 wt %, Mg:0.001 wt %, Zn:0.001 wt % and Ti:0.03 wt %, and containing Al and inevitable impurities for the remaining portion. After molten metal processing and filtering, an ingot having a thickness of 500 mm and a width of 1200 mm was made by a DC casting method. After the surface was chipped to have an average thickness of 10 mm by a surface chipper, the ingot was held at 550° C. for about 5 hours for soaking. When the temperature dropped to 400° C., the ingot was formed into a rolled plate having a thickness of 2.7 mm by using a hot rolling mill. Further, after the heat treatment carried out at 500° C. by using a continuous annealing machine, the rolled plate was finished into an aluminum plate having a thickness of 0.24 mm by cold rolling. This aluminum plate was processed to have a width of 1030 mm, and surface treatment described below was continuously carried out. Note that the aluminum plate obtained conforms to JIS A1050 material, and mean crystal grain diameters of the aluminum are 50 μm in a minor axis and 300 μm in a major axis.

(a) Mechanical Graining

Mechanical graining was carried out by rotating roller-like nylon brushes while supplying suspension containing abrasive (silica sand) having specific gravity of 1.12 and water as graining slurry liquid to the surface of the aluminum plate, using a device shown in FIG. 1. In FIG. 1, 1 represents an aluminum plate, 2 and 4 represent roll brushes, 3 represents abrasive slurry liquid and 5, 6, 7 and 8 represent supporting rollers. The abrasive had average particle size of 8 μm and maximum particle size of 50 μm. A material for the nylon brush was 6•10 nylon, having a bristle length of 50 mm, and a bristle diameter of 0.3 mm. The nylon brush was made by boring holes in a ϕ 300 mm stainless cylinder and densely implanting bristles therein. Three of such rotary brushes were prepared. Each distance between two supporting rollers (ϕ 200 mm) in the lower part of the brush was 300 mm. Each brush roller was pressed until a load of a driving motor for rotating the brush reached plus 7 kW with respect to the load before the brush roller was pressed to the aluminum plate. The rotating direction of each brush was the same as the moving direction of the aluminum plate. Rotating speed of brushes was 200 rpm.

(b) Alkali Etching

The aluminum plate obtained in the foregoing manner was subjected to spray etching by using aqueous solution containing 2.6 wt % of sodium hydroxide and 6.5 wt % of aluminum ions at a temperature of 70° C., and the aluminum plate was dissolved by 6 g/$m^2$. Then, the aluminum plate was washed by water spraying.

(c) Desmutting

The aluminum plate was subjected to spray desmutting treatment in aqueous solution of nitric acid 1 wt % (containing 0.5 wt % of aluminum ions), and then washed by water spraying. For the aqueous solution of nitric acid used in the desmutting treatment, waste solution generated in the process of electrochemical graining carried out by using an alternating current in the aqueous solution of nitric acid was utilized.

(d) Electrochemical Graining

Figure 2:
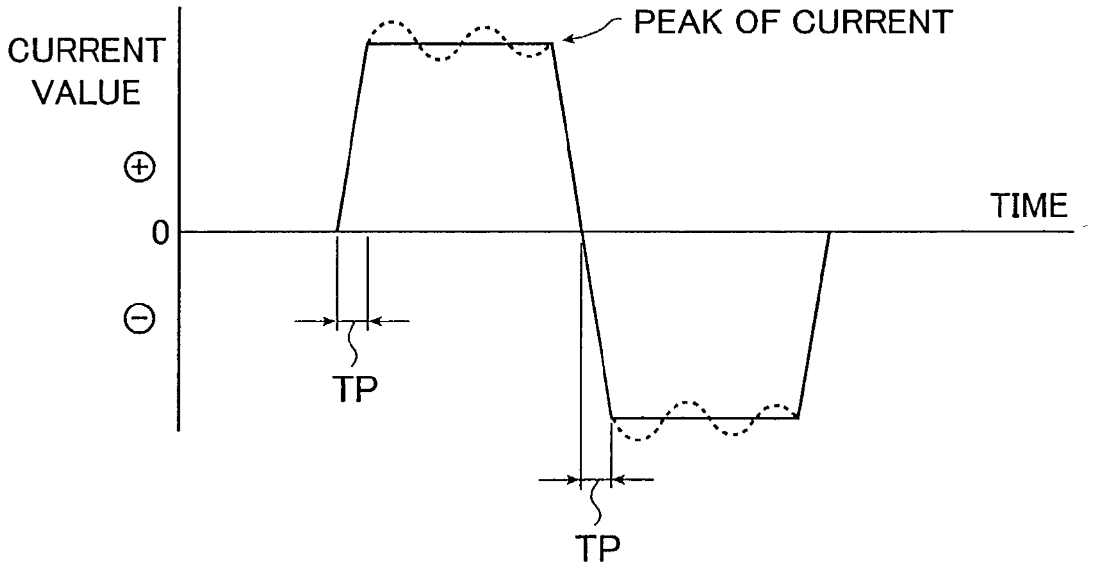
FIG. 2 is a graph showing an example of a alternating current waveform view used for electrochemical graining in preparation of an aluminum support used for a presensitized plate of the present invention.
Figure 3:
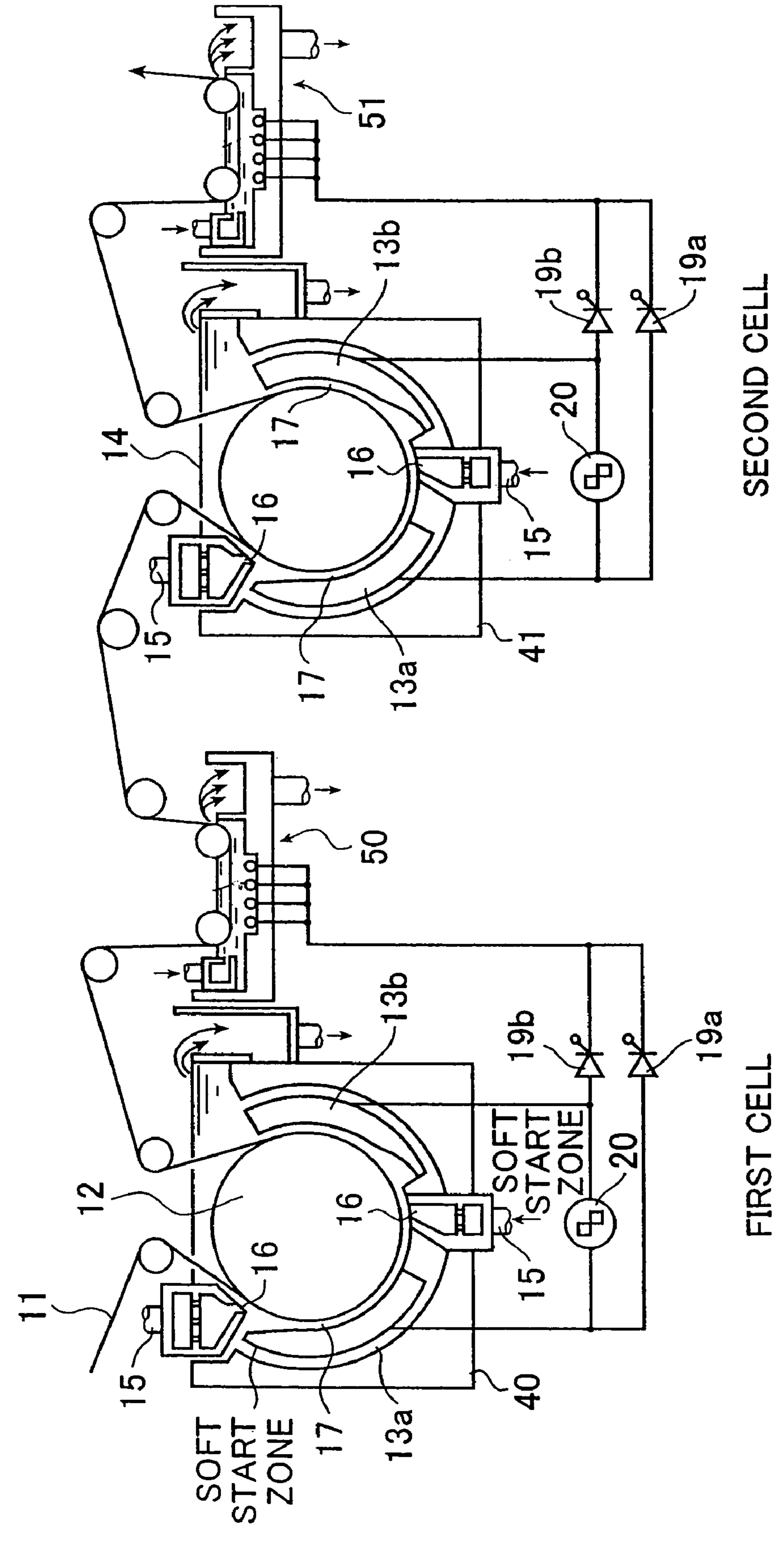
FIG. 3 is a schematic structural view of a device having at least two radial drum rollers connected used for electrochemical graining in preparation of an aluminum support used for a presensitized plate of the present invention.

Electrochemical graining treatment was continuously carried out by using an AC voltage of 60 Hz. Electrolytic solution in this case was the aqueous solution of nitric acid 10.5 g/L (containing aluminum ions 5 g/L and ammonium ions 0.007 wt %), and the temperature was 50° C. An AC power supply waveform was like that shown in FIG. 2. With the time TP necessary for a current value to reach its peak from zero set at 0.8 msec, and duty ratio set at 1:1, and by using a trapezoidal wave alternating current, the electrochemical graining treatment was carried out while carbon electrodes were set as counter electrodes. Ferrite was used for an auxiliary anode. An electrolytic cell used is shown in FIG. 3. In FIG. 3, 11 represents an aluminum plate, 12 represents a radial drum roller, 13*a* and 13*b* are main electrodes, 14 represents an electrolytic treatment liquid, 15 represents a supplying opening of the electrolytic solution, 16 represents a slit, 17 represents an electrolytic bath passage, 19*a* and 19*b* represent thyristors, 20 represents an alternating current power source, 40 and 41 represent a main electrolytic cell and 50 and 51 represent a supplementary anode cell.

A current density was 30 A/dm$^2$ at a current peak value. Regarding the quantity of electricity, the total of the quantity of electricity was 220 C/dm$^2$ when the aluminum plate was at the anode side. An amount equivalent to 5% of a current flowing from a power source was diverted to the auxiliary anode.

Then, the aluminum plate was washed by water spraying.

(e) Alkali Etching

The aluminum plate was subjected to spray etching by using aqueous solution containing 26 wt % of sodium hydroxide and 6.5 wt % of aluminum ions at a temperature of 32° C. The aluminum plate was dissolved by 0.20 g/m$^2$, a smut component mainly containing aluminum hydroxide generated in the previous stage of the electrochemical graining carried out by using the alternating current was removed, and the edge portion of a formed pit was dissolved to be made smooth. Then, the aluminum plate was washed by water spraying.

(f) Desmutting

The aluminum plate was subjected to spray desmutting in aqueous solution of sulfuric acid 15 wt % (containing 4.5 wt % of aluminum ions) at a temperature of 30° C. Then, the aluminum plate was washed by water spraying. For the aqueous solution of nitric acid used in the desmutting treatment, waste solution generated in the process of electrochemical graining carried out by using an alternating current in the aqueous solution of nitric acid was utilized.

(g) Electrochemical Graining

Electrochemical graining treatment was continuously carried out by using an AC voltage of 60 Hz. Electrolytic solution in this case was the aqueous solution of hydrochloric acid 7.5 g/L (containing aluminum ions 5 g/L), and the temperature was 45° C. An AC power supply waveform was a sin curve. The electrochemical graining treatment was carried out while carbon electrodes were set as counter electrodes. Ferrite was used for an auxiliary anode. An electrolytic cell used is shown in FIG. 3.

A current density was 25 A/dm$^2$ at a current peak value. Regarding the quantity of electricity, the total of the quantity of electricity was 50 C/dm$^2$ when the aluminum plate was at the anode side.

Then, the aluminum plate was washed by water spraying.

(h) Alkali Etching

The aluminum plate was subjected to spray etching by using aqueous solution containing 26 wt % of sodium hydroxide and 6.5 wt % of aluminum ions at a temperature of 32° C. The aluminum plate was dissolved by 0.20 g/m$^2$, a smut component mainly containing aluminum hydroxide generated in the previous stage of the electrochemical graining carried out by using the alternating current was removed, and the edge portion of a formed pit was dissolved to be made smooth. Then, the aluminum plate was washed by water spraying.

(i) Desmutting

The aluminum plate was subjected to spray desmutting in aqueous solution of sulfuric acid 25 wt % (containing 0.5 wt % of aluminum ions) at a temperature of 60° C. Then, the aluminum plate was washed by water spraying.

(j) Anodizing

Figure 4:
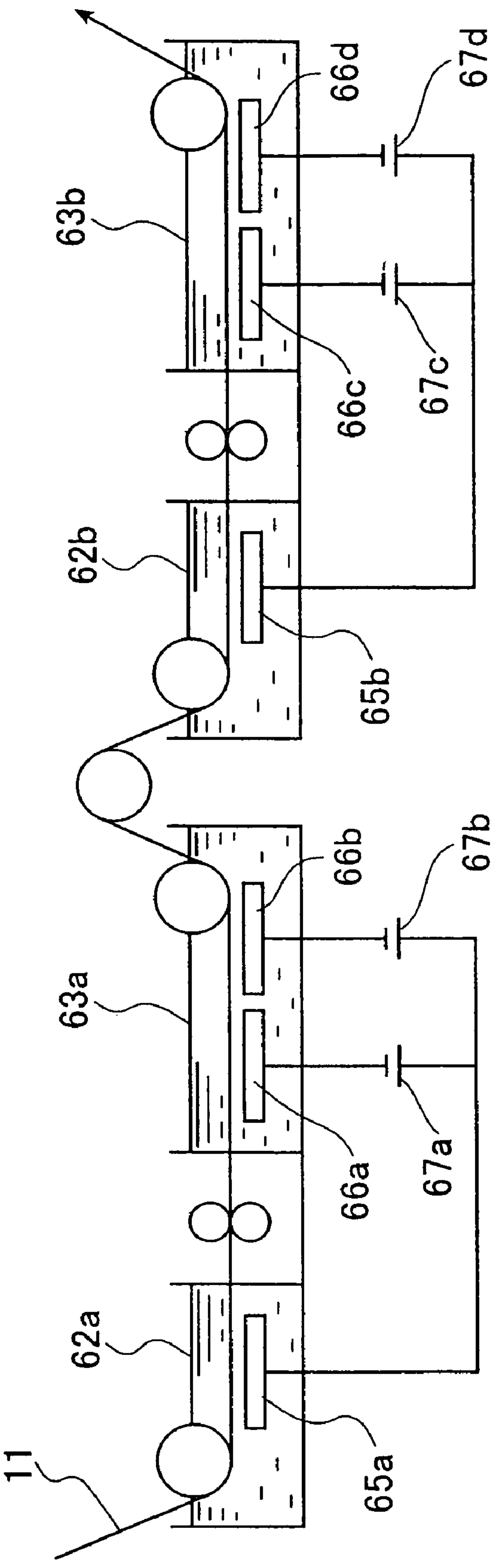
FIG. 4 is a schematic view of an anodizing device based on a two-stage power supply electrolytic method used in anodizing in preparation of an aluminum support used for a presensitized plate of the present invention.

By using the anodizing device (each of first and second electrolytic portions has a length of 6 m, each of first and second power supply units has a length of 3 m, and each of first and second power supply electrodes has a length of 2.4 m) of a two-stage power supply electrolytic method having a structure shown in FIG. 4, anodizing was carried out. Electrolytic supplied for each of the first and second electrolytic portions was sulfuric acid. For each electrolytic, the concentration of sulfuric acid was 50 g/L (containing 0.5 wt % of aluminum ions) and a temperature was 20° C. Then, the aluminum plate was washed by water spraying.

In the above-described anodizing device, currents from power sources 67*a* and 67*b* flow to a first power supply electrode 65*a* provided in a first power supply unit 62*a*, and flow through electrolytic solution to an aluminum plate 11. At a first electrolytic portion 63*a*, an oxide layer is formed on the surface of the aluminum plate 11. Then, the currents are passed through electrolytic electrodes 66*a* and 66*b* provided in the first electrolytic portion 63*a*, and returns to the power sources 67*a* and 67*b*.

On the other hand, currents from power sources 67*c* and 67*d* flow to a second power supply electrode 65*b* provided in a second power supply unit 62*b*, and flow through electrolytic solution to the aluminum plate 11 similarly to the above case. At a second electrolytic portion 63*b*, an oxide layer is formed on the surface of the aluminum plate 11. Then, the currents are passed through electrolytic electrodes 66*c* and 66*d* provided in the second electrolytic portion 63*b*, and returns to the power sources 67*c* and 67*d*.

The quantity of electricity supplied from each of the power sources 67*a* and 67*b* to the first power supply unit 62*a* was equal to that supplied from the power sources 67*c* and 67*d* to the second power supply unit 62*b*. Each of power supply current density on the surface of the oxide layer at the first electrolytic portion 63*a* and the second electrolytic portion 63*b* was about 30 A/dm$^2$. It means that at the second power supply unit 62*b*, electric power was supplied through the oxide layer of 1.35 g/m$^2$ formed by the first electrolytic portion 63*a*. The amount of oxide layer was 2.7 g/m$^2$ at the end.

(k) Alkali Metal Silicate Treatment

Alkali metal silicate treatment (silicate treatment) was carried out by dipping a support for lithographic printing plate, obtained by the anodizing, into a treatment cell with the aqueous solution containing 1 wt % of III-sodium silicate at a temperature of 30° C. for 10 sec. Then, the support was washed by water spraying using well water.

(l) Formation of Undercoat Layer

Coating solution for undercoat layer having a composition described below was coated on the aluminum support treated with the alkali metal silicate, obtained in the foregoing manner, and dried at a temperature of 80° C. for 15 sec, to form a layer. The coating amount after drying was 15 mg/M$^2$.

<Composition of coating solution for undercoat layer>

| | MOLECULAR WEIGHT |
|---|---|
| high-molecular compound described below | 0.3 g |
| methanol | 100 g |
| water | 1 g |

-continued

| <Composition of coating solution for undercoat layer> | MOLECULAR WEIGHT |
|---|---|
| 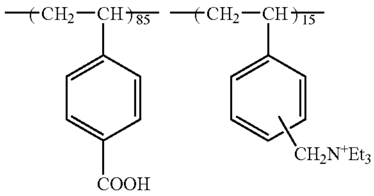 | |
| (m) Formation of thermosensitive layer A | |

Subsequently, coating solution 1 for thermosensitive layer having a composition described below was prepared and, the coating solution 1 for thermosensitive layer was coated over the aluminum support having the undercoat layer formed thereon, so that the amount after drying (the coating amount of thermosensitive layer) meets 1.0 $g/m^2$. Then, drying was carried out in order to form a thermosensitive layer A. In this way, the presensitized plate of Example 1 was obtained.

| <Composition of coating solution 1 for thermosensitive layer> | |
|---|---|
| capric acid | 0.03 g |
| particular copolymer 1 described later (N-(p-aminosulfonyl phenyl) methacrylamide/ethyl methacrylate/acrylonitrile (32/43/25 mol %) copolymer having a weight-average molecular weight of 53,000) | 0.75 g |
| m, p-cresol novolac (m/p ratio = 6/4, weight-average molecular weight 3,500, and containing 0.5 wt % of unreacted cresol) | 0.25 g |
| p-toluenesulfonic acid | 0.003 g |
| tetrahydrophathalic anhydride | 0.03 g |
| cyanine dye A having a structural formula described below | 0.017 g |
| CYANINE DYE A | |
| 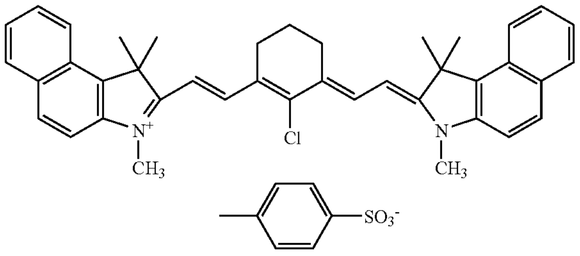 | |
| dye prepared by setting a counter ion of Victorian pure blue BOH as 1-naphthalene sulfonic acid anion | 0.015 g |
| fluorine-containing surfactant (Megaface F177, by Dainippon Ink and Chemicals Inc.) | 0.05 g |
| γ-butyrolactone | 10 g |
| methyl ethyl ketone | 10 g |
| 1-methoxy-2-propanol | 1 g |

<Particular Copolymer 1>

Methacrylic acid 31.0 g (0.36 mol), ethyl chloroformate 39.1 g (0.36 mol) and acetonitrile 200 mL were put in a 500 mL-capacity three-neck flask having an agitator, a cooling pipe and a dropping funnel, and a mixture was agitated while beeing cooled in an ice-water bath. Triethylamine 36.4 g (0.36 mol) was dropped to this mixture with the dropping funnel for about 1 hour. After the end of the dropping, the ice-water bath was removed and the mixture was agitated at a room temperature for 30 min.

Then, p-aminobenzene sulfonamide 51.7 g (0.30 mol) was added to the reactive mixture, and agitated for 1 hour while being heated to 70° C. in an oil bath. After the end of the reaction, the mixture was thrown into water 1 L while agitating the water, and the obtained mixture was agitated for 30 min. The mixture was filtered to remove deposition. After this deposition was turned into a slurry in water 500 mL, the slurry was filtered and, by drying an obtained solid, a white solid containing N-(p-aminosulfonyl phenyl) methacrylamide was obtained (yield 46.9 g).

Subsequently, N-(p-aminosulfonyl phenyl) methacrylamide 4.61 g (0.0192 mol), ethyl methacrylate 2.94 g (0.0258 mol), acrylonitrile 0.80 g (0.015 mol) and N,N-dimethyl acetamide 20 g were put in a 20 mL-capacity three-neck flask having an agitator, a cooling pipe and a dropping funnel. Then, a mixture was agitated while being heated to 65° C. in a hot-water bath. "V-65" (by Wako Pure Chemical Industries, Ltd.) 0.15 g was added to the mixture, and the mixture was agitated under a nitrogen gas flow for 2 hours while being maintained at 65° C. To this reactive mixture, the mixture of N-(p-aminosulfonyl phenyl) methacrylamide 4.61 g, ethyl methacrylate 2.94 g, acrylonitrile 0.80 g, N,N-dimethyl acetamide and "V-65" 0.15 g was further dropped with the dropping funnel for 2 hours. After the end of the dropping, the obtained mixture was further agitated at 65° C. for 2 hours. After the end of the reaction, methanol 40 g was added to the mixture, and cooled. The obtained mixture was then thrown into water 2 L while agitating the water. After the mixture was agitated for 30 min, deposition was removed by filtering, and the deposition was dried. Thus, a particular copolymer 1 which is a white solid of 15 g was obtained.

The weight-average molecular weight of the obtained particular copolymer 1 was measured by gel permeation chromatography, and it was 53,000 (polystyrene standard).

Example 2

A presensitized plate was obtained by a method similar to that of Example 1, except for the fact that the (d), (e) and (f) were not carried out.

Example 3

A presensitized plate was obtained by a method similar to that of Example 1, except for the fact that in the (h) alkali etching treatment, quantity of dissolved aluminum plate was set to 0.8 $g/m^2$.

Example 4

A presensitized plate was obtained by a method similar to that of Example 1, except for the fact that the (a), (d), (e) and (f) were not carried out and, in the (g) electrochemical graining treatment, the total of the quantity of electricity when the aluminum plate was at the anode side was set to 450 $C/dm^2$.

Example 5

A presensitized plate was obtained by a method similar to that of Example 4, except for the fact that in the (h) alkali etching treatment, quantity of dissolved aluminum plate was set to 0.8 $g/m^2$.

Example 6

A presensitized plate was obtained by a method similar to that of Example 1, except for the fact that using an aluminum plate containing 0.13 wt % of Si, 0.01 wt % of Cu, and 0.2 wt % of Fe and having mean crystal grain diameters of the aluminum are 300 μm in a minor axis and 2000 μm in a major axis.

Example 7

A presensitized plate was obtained by a method similar to that of Example 1, except for the fact that (n) described below was carried out instead of the (m).

(n) Formation of Thermosensitive Layer B

Coating solution for thermosensitive layer having a composition described below was coated over the aluminum support, and dried at a temperature of 140° C. for 50 sec. by using PERFECT OVEN PH200 manufactured by Tabai Espec Corp. with Wind Control set to 7. Then, coating solution 2 for thermosensitive layer having a composition described below was coated over the aluminum support so that the coating amount meets 0.15 $g/m^2$ and dried at a temperature of 120° C. for 1 min. In this way, the presensitized plate of Example 7 comprising thermosensitive layer B was obtained.

| | |
|---|---|
| <Composition of coating solution for undercoat layer> | |
| N-(4-aminosulfonyl phenyl) methacrylamide/acrylonitrile/ methyl methacrylate (36/34/30, weight-average molecular weight 53,000) copolymer | 1.896 g |
| cresol novolac resin (m/p = 6/4, weight-average molecular weight 4,500, and containing 0.8 wt % of residual monomer) | 0.237 g |
| cyanine dye A having a structural formula described above | 0.109 g |
| 4,4'-bishydroxy phenylsulfone | 0.063 g |
| tetrahydrophathalic anhydride | 0.190 g |
| p-toluenesulfonic acid | 0.008 g |
| one prepared by setting a counter ion of ethyl violet as 6-hydroxynaphthalene sulfone | 0.05 g |
| fluorine-containing surfactant (Megaface F176, by Dainippon Ink and Chemicals Inc.) | 0.035 g |
| methyl ethyl ketone | 26.6 g |
| 1-methoxy-2-propanol | 13.6 g |
| γ-butyrolactone | 13.8 g |
| <Composition of coating solution 2 for thermosensitive layer> | |
| m, p-cresol novolac (m/p ratio = 6/4, weight-average molecular weight 3,500, and containing 0.8 wt % of unreacted cresol) | 0.237 g |
| cyanine dye A having a structural formula described above | 0.047 g |
| dodecyl stearilate | 0.060 g |
| 3-methoxy-4-diazodiphenylamine hexaflorophosphate | 0.030 g |
| fluorine-containing surfactant (Megaface F176, by Dainippon Ink and Chemicals Inc.) | 0.110 g |
| fluorine-containing surfactant (Megaface MCF-312 (30 wt %), by Dainippon Ink and Chemicals Inc.) | 0.120 g |
| methyl ethyl ketone | 15.1 g |
| 1-methoxy-2-propanol | 7.7 g |

Example 8

An aluminum plate having mean crystal grain diameters of the aluminum are 300 μm in a minor axis and 1000 μm in a major axis was obtained by a method similar to preparation of the aluminum plate used in Example 1, except for the fact that heat treatment by using a continuous annealing machine was carried out at 600° C.

A presensitized plate was obtained by a method similar to that of Example 1, except for the fact that using this aluminum plate.

Comparative Example 1

A presensitized plate was obtained by a method similar to that of Example 1, except for the fact that the (a), (d), (e) and (f) were not carried out.

Comparative Example 2

A presensitized plate was obtained by a method similar to that of Example 1, except for the fact that the (g), (h) and (i) were not carried out.

Example 9

A presensitized plate was obtained by a method similar to that of Example 1, except for the fact that the (a) was not carried out; in the (b), concentration of sodium hydroxide set to 26 wt %; in the (g), a temperature of electrolyte was set to 35° C. and an AC power supply waveform used was a trapezoidal wave; in the (h), quantity of dissolved aluminum plate was set to 0.10 $g/m^2$; in the (j), concentration of sulfuric acid in electrolyte was set to 170 g/L (containing 0.5 wt % of aluminum ions) and a temperture of electrolyte was set to 43° C.

Example 10

A presensitized plate was obtained by a method similar to that of Example 9, except for the fact that the (a) was carried out and the (d), (e) and (f) were not carried out.

Example 11

A presensitized plate was obtained by a method similar to that of Example 9, except for the fact that in the (h), quantity of dissolved aluminum plate was set to 0.6 $g/m^2$.

Example 12

A presensitized plate was obtained by a method similar to that of Example 9, except for the fact that the (d), (e) and (f) were not carried out and in the (g), the total of the quantity of electricity when the aluminum plate was at the anode side was set to 450 $C/dm^2$.

Example 13

A presensitized plate was obtained by a method similar to that of Example 12, except for the fact that in the (h), quantity of dissolved aluminum plate was set to 0.6 $g/m^2$.

Example 14

A presensitized plate was obtained by a method similar to that of Example 9, except for the fact that using an aluminum plate containing 0.13 wt % of Si, 0.01 wt % of Cu, and 0.2 wt % of Fe and having mean crystal grain diameters of the aluminum are 300 μm in a minor axis and 2000 μm in a major axis.

Example 15

A presensitized plate was obtained by a method similar to that of Example 9, except for the fact that the (n) was carried out instead of the (m).

Comparative Example 3

A presensitized plate was obtained by a method similar to that of Example 9, except for the fact that the (g), (h) and (i) were not carried out.

Comparative Example 4

A presensitized plate was obtained by a method similar to that of Example 9, except for the fact that the (a) was carried out and the (g), (h) and (i) were not carried out.

Example 16

A presensitized plate was obtained by a method similar to that of Example 1, except for the fact that (O) described below was carried out instead of the (m).

(o) Formation of Thermosensitive Layer C

Subsequently, coating solution 3 for thermosensitive layer having a composition described below was prepared and, the coating solution 3 for thermosensitive layer was coated over the aluminum support having the undercoat layer formed thereon, so that the amount after drying (the coating amount of thermosensitive layer) meets 2.0 g/$m^2$. Then, drying was carried out in order to form a thermosensitive layer C. In this way, the presensitized plate of Example 15 was obtained. Note that, as is understood by composition of coating solution 3 for thermosensitive layer, a ratio of novolak resin to the high-molecular resins insoluble in water and soluble in an alkali comprised in thermosensitive layer C was 100 wt %.

| <Composition of coating solution 3 for thermosensitive layer> | |
|---|---|
| m, p-cresol novolac (m/p ratio = 6/4, weight-average molecular weight 7,500, and containing 0.5 wt % of unreacted cresol) | 0.75 g |
| cyanine dye A having a structural formula described above | 0.04 g |
| p-toluenesulfonic acid | 0.002 g |
| tetrahydrophathalic anhydride | 0.05 g |
| dye prepared by setting a counter ion of Victorian pure blue BOH as 1-naphthalene sulfonic acid anion | 0.015 g |
| fluorine-containing surfactant (Megaface F-176, by Dainippon Ink and Chemicals Inc.) | 0.02 g |
| γ-butyrolactone | 8 g |
| methyl ethyl ketone | 7 g |
| 1-methoxy-2-propanol | 7 g |

Example 17

A presensitized plate was obtained by a method similar to that of Example 16, except for the fact that the (d), (e) and (f) were not carried out.

Example 18

A presensitized plate was obtained by a method similar to that of Example 16, except for the fact that in the (h), quantity of dissolved aluminum plate was set to 0.8 g/$m^2$.

Example 19

A presensitized plate was obtained by a method similar to that of Example 16, except for the fact that the (a), (d), (e) and (f) were not carried out and in the (g), the total of the quantity of electricity when the aluminum plate was at the anode side was set to 450 C/$dm^2$.

Example 20

A presensitized plate was obtained by a method similar to that of Example 19, except for the fact that in the (h), quantity of dissolved aluminum plate was set to 0.8 g/$m^2$.

Example 21

A presensitized plate was obtained by a method similar to that of Example 16, except for the fact that using an aluminum plate containing 0.13 wt % of Si, 0.01 wt % of Cu, and 0.2 wt % of Fe and having mean crystal grain diameters of the aluminum are 300 μm in a minor axis and 2000 um in a major axis.

Example 22

A presensitized plate was obtained by a method similar to that of Example 16, except for the fact that in the (h), quantity of dissolved aluminum plate was set to 0.01 g/$m^2$.

Example 23

A presensitized plate was obtained by a method similar to that of Example 16, except for the fact that in the (h), quantity of dissolved aluminum plate was set to 1.6 g/$m^2$.

Referential Example 2

A presensitized plate was obtained by a method similar to that of Example 16, except for the fact that (p) described below was carried out instead of the (O).

(p) Formation of Thermosensitive Layer D

Coating solution 4 for thermosensitive layer having a composition described below was prepared and, the coating solution 3 for thermosensitive layer was coated over the aluminum support having the undercoat layer formed thereon, so that the amount after drying (the coating amount of thermosensitive layer) meets 1.0 g/$m^2$. Then, drying was carried out in order to form a thermosensitive layer D. In this way, the presensitized plate was obtained. Note that, as is understood by composition of coating solution 4 for thermosensitive layer, a ratio of novolak resin to the high-molecular resins insoluble in water and soluble in an alkali comprised in thermosensitive layer D was 14.9 wt %.

| <Composition of coating solution 4 for thermosensitive layer> | |
|---|---|
| N-(4-aminosulfonyl phenyl) methacrylamide/acrylonitrile/methyl methacrylate (35/35/30, weight-average molecular weight 50,000) copolymer | 1.896 g |
| m,p-cresol novolac resin (m/p ratio = 6/4, weight-average molecular weight 4,500, and containing 0.8 wt % of unreacted cresol) | 0.332 g |
| cyanine dye A having a structural formula described above | 0.155 g |
| 4,4'-bishydroxy phenylsulfone | 0.063 g |
| tetrahydrophathalic anhydride | 0.190 g |
| p-toluenesulfonic acid | 0.008 g |
| one prepared by setting a counter ion of ethyl violet as 6-hydroxynaphthalene sulfone | 0.05 g |
| fluorine-containing surfactant (Megaface F176, by Dainippon Ink and Chemicals Inc.) | 0.145 g |
| fluorine-containing surfactant (Megaface MCF-312 (30 wt %), by Dainippon Ink and Chemicals Inc.) | 0.120 g |
| methyl ethyl ketone | 26.6 g |
| 1-methoxy-2-propanol | 13.6 g |
| γ-butyrolactone | 13.8 g |

Comparative Example 5

A presensitized plate was obtained by a method similar to that of Example 16, except for the fact that the (a), (d), (e) and (f) were not carried out.

Comparative Example 6

A presensitized plate was obtained by a method similar to that of Example 16, except for the fact that the (g), (h) and (i) were not carried out.

Comparative Example 7

A presensitized plate was obtained by a method similar to that of Example 16, except for the fact that the (a), (d), (e) and (f) were not carried out.

2. Measurement of Mean Wavelength of a Grained Structure with Small Undulation on a Surface of the Aluminum Support The thermosensitive layers of each presensitized plate obtained according to Examples 1 to 8 and 15 to 22, Comparative Examples 1, 2 and 5 to 7 and Reference Example 2 were dissolved and removed by using y-butyrolactone and the surface of aluminum support was exposed. Subsequently, SEM photograph of the support surface was taken at 30,000 magnification with a scanning electron microscope (S-900 made by Hitachi, Ltd.) from the direction perpendicular to the support. In the SEM photograph, a shape where a contour surrounds a concave portion was identifiable was deemed as a pit. Further, a pit with a mean value of its major and minor axes of 1.0 μm or less and which does not further contain a pit was regarded as small undulation. However, as a pit in this case, a concave portion of micropore in an anodized layer was excluded. A mean value of 100 pits was deemed to be a mean wavelength of small undulation.

In addition, SEM photograph of each presensitized plate obtained according to the above Examples 9 to 15 and Comparative Examples 3 and 4 was taken in the same manner as in the foregoing except at 50,000 magnification. In the SEM photographs, a shape with an identifiable contour surrounding a concave portion was deemed as a pit. Further, a pit with a mean value of its major and minor axes of 0.01 to 0.5 μm and which does not further contain a pit was regarded as small undulation. However, as a pit in this case, a concave portion in micropore in an anodized layer was excluded. A mean value of 20 pits was deemed to be a mean wavelength of small undulation (pit diameter).

The measurement results are shown in Tables 1 to 3. The "-"s in the tables indicate that there is no concave portion with corresponding wavelength.

3. Measurement of Mean Wavelengths of a Grained Structure with Large Undulation and a Grained Structure with Medium Undulation on Surfaces of Aluminum Supports The thermosensitive layers of each presensitized plate obtained according to the above Examples 1 to 8 and 16 to 23, Comparative Examples 1, 2 and 5 to 7 and Reference Example 2 were dissolved and removed by using γ-butyrolactone and the support surface was exposed. Then, the support surface was slanted at 30 degrees from the normal direction and observed at 2,000 magnification with T-20 type scanning electron microscope made by JEOL, profile asperity components with a wavelength of 2 μm or longer and profile asperity components with a wavelength of at or more than 0.6 μm and at or less than 2 μm were respectively measured at 30 points in the horizontal direction. Each mean value was regarded as a mean value of a grained structure with large undulation and a mean value of a grained structure with medium undulation.

In addition, the thermosensitive layers of each presensitized plate obtained from Examples 9 to 15 and Comparative Examples 3 and 4 were dissolved and removed by using γ-butyrolactone and the support surface was exposed. The support surface was slanted at 45 degrees from the normal direction and observed at 3,500 magnification with T-20 type scanning electron microscope made by JEOL, distances between the ridges were respectively measured at 30 points in the horizontal direction and each mean value was regarded as a mean wavelength of a grained structure with large undulation.

The measurement results are shown in Tables 1 to 3. The "-"s in the tables indicate that there is no concave portion with corresponding wavelength.

4. Measurement of Steepness a45 on the Surface of the Aluminum Support

The steepness a 45 on surface of aluminum support used in Examples 1 to 8 and 16 to 23, Comparative Examples 1, 2 and 5 to 7 and Reference Example 2 was measured with an atomic force microscope (SP13700 made by Seiko Instruments Inc.) in the manner as described above.

The measurement results are shown in Tables 1 and 2.

5. Evaluation of Damage Resistance of Presensitized Plates

For each of the presensitized plates made in Example 1 to 15 and Comparative Example 1 to 4, evaluation was made as to damage resistance thereof.

An interleaving sheet was placed on the thermosensitive layer surface of the presensitized plate, put corrugated by fiberboard between top and bottom thereof, and left under an environment of 25° C. and 50% RH for 3 days. Then, the thermosensitive layer surface of the presensitized plate was rubbed with a cotton glove 5 times back and forth, and developed by an automatic developing machine 900NP using PS developer DT-1 manufactured by Fuji Photo Film Co., Ltd. under standard use conditions. A level of clear of the rubbed portion caused by scratching was visually observed, and evaluated.

A mark ○ represents no changes at all from before development, X almost no visibility of thermosensitive layer color caused by substantial exposure of the support and ○Δ, Δ, and ΔX intermediate levels thereof.

The results are shown in Tables 1 and 2.

6. Evaluation of Sensitivity of Presensitized Plate

A quantity of plate surface energy of each presensitized plate obtained in the above Examples 1 to 15 and Comparative Examples 1 to 4 was changed with TrendSetter 3244 made by CREO and the entire plates were exposed. Subsequently, the plates were developed by the automatic developer 900NP using a developer for PS plate, containing substantially no alkali metal silicate, DT-1 made by Fuji Photo Film Co., Ltd. in the standard working condition. The sensitivity was evaluated by one quantity of plate surface energy when a complete removal of the thermosensitive layer was visually observed.

The results are shown in Tables 1 and 2.

7. Evaluation of Scum Resistance of Presensitized Plate

Each presensitized plate obtained according to the above Examples 1 to 15 and Comparative Examples 1 to 4 was image exposed at a quantity of plate surface energy of 140 $mJ/cm^2$ with TrendSetter 3244 made by CREO and was developed by the automatic developer 900NP using a developer for PS plate, containing substantially no alkali metal silicate, DT-1 made by Fuji Photo Film Co., Ltd. in the standard working condition. Printing was performed on the thus obtained lithographic printing plate with an ink of DIC-GEOS (s) magenta by Mitsubishi Dia Type F2 Printing Machine (made by Mitsubishi Heavy Industries, Ltd.). Stain of the blankets after printing 10,000 sheets was checked by visual inspection.

The blanket with substantially no stain was represented by ○, the blanket with some stain was represented by Δ, and the blanket with remarkable stain was represented by X.

The results are shown in Tables 1 and 2.

8. Evaluation of Press Life of Presensitized Plate

In a similar manner as the aforementioned evaluation of scum resistance, lithographic printing plates were obtained from each presensitized plate obtained according to the above Examples 1 to 15 and Comparative Examples 1 to 4. Printing was performed on the lithographic printing plates using DIC-GEOS(N) black as an ink made by Dainippon Ink And Chemicals, Inc. by Lithrone printing machine made by Komori Corporation. Press life was evaluated by the number of printing at a time when it was recognized by visual inspection that concentration of the solid image began to drop.

The results are shown in Tables 1 and 2.

9. Influence of Development

The presensitised plate obtained according to Example 1 was developed by using a developer containing alkali metal silicates (a developer for PS plate, DP-4 made by Fuji Photo Film Co., Ltd.) in the standard working condition. In a similar manner to the foregoing, the damage resistance and sensitivity of the presensitized plate and scum resistance and press life of the lithographic printing plate were evaluated.

The results are shown in Table 1 as Reference Example 1.

10. Exposure

Each presensitised plate obtained according to the above Examples 16 to 23, Comparative Examples 5 to 7 and Reference Example 2 was exposed with a quantity of plate surface energy of 140 $mJ/cm^2$ (with varied quantity of plate surface energy in the evaluation of sensitivity to be later described) by using TrendSetter 3244 made by CREO, and development was performed on them to be later described.

11. Development

The following development was performed on each presensitised plate obtained according to the above Examples 16 to 23, Comparative Examples 5 to 7 and Reference Example 2 corresponding to the kinds of thermosensitive layers, the lithographic printing plates were thus prepared and were used for each evaluation to be later described.

(1) Thermosensitive Layer C

Development was performed using a developer 1 containing substantially no alkali metal silicates and containing saccharides under the conditions at 30° C. for 20 seconds by an auto developer PS900NP made by Fuji Photo Film Co., Ltd.

Note that developer 1 was obtained by adding 2 g of ampholytic surfactant (Pionin C-158G made by Takemoto Oil & Fat Co., Ltd.), 2 g of adding ampholytic surfactant (Pionin D-1107 made by Takemoto Oil & Fat Co., Ltd.) and 0.2 g of antiforming agent (OLFINE AK-02 made by Nissin Chemical Industry Co., Ltd.) to an aqueous solution 1L of potassium salts 5 wt % comprising D-sorbitol/potassium oxide ($K_2O$) where a non-reducing sugar and a base are combined.

(2) Thermosensitive Layer D

Development was performed using a developer 2 containing substantially no alkali metal silicates and containing saccharides (a developer for PS plate, DT-1 made by Fuji Photo Film Co., Ltd.) in the standard working condition by an auto developer, PS900NP made by Fuji Photo Film Co., Ltd.

12. Evaluation of Sensitivity of Presensitized Plate

Each presensitised plate obtained according to the above Examples 16 to 23, Comparative Examples 5 to 7 and Reference Example 2 was exposed by changing a quantity of plate surface energy using TrendSetter 3244 made by CREO. Subsequently, development was performed in the above developing condition and the sensitivity was evaluated by a quantity of plate surface energy required to completely remove residual layers of the exposure area (minimum quantity of energy), which may be checked by visual inspection.

The results are shown in Table 3.

13. Evaluation of Scum Resistance

Printing was performed by Mitsubishi Dia Type F2 Printing Machine (made by Mitsubishi Heavy Industries, Ltd.) using the lithographic printing plate thus obtained with an ink of DIC-GEOS (s) magenta (made by Dainippon Ink And Chemicals, Inc.). Stain of the blankets after printing 1,000 sheets was checked by visual inspection.

The results are shown in Table 3. ○, ○Δ and Δ are respectively marked from the least stain in ascending order.

14. Evaluation of Press Life of Lithographic Printing Plate (1) Press Life Not Subjected to Burning-in Processing Printing was performed on the obtained lithographic printing plates using DIC-GEOS(N) black made by Dainippon Ink And Chemicals, Inc. by Lithrone Printing Machine made by Komori Corporation. Press life thereof was evaluated by the number of printing at a time when it was recognized by visual inspection that concentration of the solid image began to drop.

The results are shown in Table 3.

(2) Press Life After Burning-in Processing

After wiping out the plate surface of the lithographic printing plate obtained with a burning-in surface adjusting liquid, BC-3 made by Fuji Photo Film Co., Ltd., burning-in processing was performed on the plates at about 240° C. for 7 minutes. Then, the plates were washed by water and were processed with a solution where a mass of Gum GU-7 made by Fuji Photo Film Co., Ltd. was doubly diluted with water.

The lithographic printing plate thus obtained after burning-in processing was evaluated in a similar manner when press life of the plate not subjected to burning-in processing was evaluated.

The results are shown in Table 3.

As apparent from Tables 1 to 3, a presensitized plate according to the present invention using an aluminum support having a grained structure with large undulation, a grained structure with medium undulation, and a grained structure with small undulation on the surface thereof, and a presensitized plate according to the present invention using an aluminum support having a grained structure with large undulation and a grained structure with small undulation on the surface thereof were excellent in damage resistance and sensitivity, and when they were processed into lithographic printing plates, they were also excellent in scum resistance and press life.

On the contrary, in the case where an aluminum support had only a grained structure with small undulation on the surface thereof (in Comparative Examples 1, 5 and 7), or in the case where an aluminum support had no grained structure with small undulation on the surface thereof (in Comparative Examples 2, 3, 4 and 6), press life was poor since an adhesion between a thermosensitive layer and a support was not sufficient. Moreover, in the case where an aluminum support had no grained structure with small undulation on the support surface, scum resistance was also poor since there were a number of sharp areas on it.

In addition, when a presensitized plate in Example 1 according to the present invention was developed with a developer containing alkali metal silicates, sensitivity thereof was lower, and scum resistance was poor when the plate was processed into the lithographic printing plate (in Reference Example 1). That is, it is understood that a presensitized plate according to the present invention is preferably one to be processed with a developer containing substantially no alkali metal silicates.

In addition, the presensitized plates according to the present invention (in Examples 16 to 23) had respectively increased the number of printing which is a criteria of press life, by burning-in processing by about twice to three times, thus press life proved to have been very increasingly enhanced. This is a remarkable effect that may not be expected from the effect of burning-in processing in the presensitized plate using a conventional aluminum support and having a thermosensitive layer made mainly by novolac resin (in Comparative Examples 5 and 6).

Particularly, in the case where the mean wavelength of a grained structure with small undulation was 0.01 to 0.6 μm (in Examples 16 to 21), the number of printing which is a criteria of press life of each plate has increased by about three times as burning-in processing had been performed. It is preferable since press life was especially excellent and scum resistance was also excellent.

On the contrary, in the case where an aluminum support had only a grained structure with small undulation on the surface thereof and the thermosensitive layer contained too little novolac resin (in Comparative Example 7), press life was poor and the improvement effect of press life by burning-in processing was small. Moreover, although the surface profile of an aluminum support was within the scope of the present invention, the improvement effect of press life by burning-in processing was small in the case where the thermosensitive layer contained too little novolac resin (in Reference Example 2).

In addition, even though the content of novolac resin in the thermosensitive layer was within a preferable range according to the present invention, the improvement effect of press life by burning-in processing was not great in the case where an aluminum support had only a grained structure with small undulation on the surface thereof (in Comparative Example 5) or an aluminum support had no grained structure with small undulation on the surface thereof (in Comparative Example 6).

TABLE 1

| | Aluminum support | | | | | | | | | |
|---|---|---|---|---|---|---|---|---|---|---|
| | Wavelength of large undulation (μm) | Wavelength of medium undulation (μm) | Wavelength of small undulation (μm) | Steepnes degree a45 | Thermosensitive layer | Developer | Damage resistance | Sensitivity ($mJ/cm^2$) | Scum resistance | Press life (10,000 sheets) |
| Example 1 | 11 | 1.0 | 0.12 | 27.8 | A | DT-1 | ○Δ | 100 | ○ | 10 |
| Example 2 | 11 | — | 0.12 | 18.6 | A | DT-1 | ○Δ | 90 | ○ | 8 |
| Example 3 | 11 | 1.0 | 0.36 | 26.5 | A | DT-1 | Δ | 90 | ○ | 9 |
| Example 4 | 15 | — | 0.12 | 17.1 | A | DT-1 | ○Δ | 80 | ○ | 7 |
| Example 5 | 15 | — | 0.36 | 17.1 | A | DT-1 | Δ | 80 | ○ | 7 |
| Example 6 | 11 | 1.5 | 0.12 | 30.3 | A | DT-1 | ○Δ | 110 | ○Δ | 11 |
| Example 7 | 11 | 1.0 | 0.12 | 27.9 | B | DT-1 | ○ | 100 | ○ | 10 |
| Example 8 | 11 | 1.0 | 0.12 | 28.2 | A | DT-1 | ○Δ | 100 | ○Δ | 12 |
| Comparative Example 1 | — | — | 0.12 | 2.5 | A | DT-1 | X | 120 | ○ | 3 |
| Comparative Example 2 | 11 | 1.0 | — | 36.7 | A | DT-1 | X | 120 | Δ | 3 |
| Reference Example 1 | 11 | 1.0 | 0.12 | 27.5 | A | DP-4 | Δ | 150 | X | 11 |

TABLE 2

| | Wavelength of large undulation (μm) | Wavelength of small undulation (μm) | Sensitivity ($mJ/cm^2$) | Damage resistance | Scum resistance | Press life (10,000 sheets) |
|---|---|---|---|---|---|---|
| Example 9 | 1.0 | 0.12 | 70 | ○ | ○ | 12 |
| Example 10 | 8.0 | 0.12 | 65 | ○ | ◎ | 10 |
| Example 11 | 1.0 | 0.19 | 55 | ○ | ○ | 7 |
| Example 12 | 10.0 | 0.13 | 75 | ○ | ○ | 10.5 |
| Example 13 | 10.0 | 0.19 | 70 | ○ | ○ | 7.5 |
| Example 14 | 1.2 | 0.12 | 70 | ○Δ | ○ | 8.5 |
| Example 15 | 1.0 | 0.10 | 70 | ◎ | ○ | 10 |

TABLE 2-continued

| | Wavelength of large undulation (μm) | Wavelength of small undulation (μm) | Sensitivity (mJ/cm$^2$) | Damage resistance | Scum resistance | Press life (10,000 sheets) |
|---|---|---|---|---|---|---|
| Comparative Example 3 | 1.0 | — | 70 | X | X | 5 |
| Comparative Example 4 | 8.0 | — | 150 | Δ | Δ | 4.5 |

TABLE 3

| | Aluminum support | | | | | | | | Press life | |
|---|---|---|---|---|---|---|---|---|---|---|
| | Wave-length of large undula-tion (μm) | Wave-length of medium undula-tion (μm) | Wave-length of small undula-tion (μm) | Steepness degree a45 | Thermosen-sitive layer | Devel-oper | Sensitivity (mJ/mc$^2$) | Scum resist-ance | Not subjected to burning in processing (10,000 sheets) | Subject to burning in processing (10,000 sheets) |
| Example 16 | 11 | 1.0 | 0.12 | 27.8 | A | 1 | 90 | ○ | 10 | 30 |
| Example 17 | 11 | — | 0.12 | 18.6 | A | 1 | 80 | ○ | 8 | 23 |
| Example 18 | 11 | 1.0 | 0.36 | 26.5 | A | 1 | 80 | ○ | 9 | 25 |
| Example 19 | 15 | — | 0.12 | 17.1 | A | 1 | 70 | ○ | 7 | 20 |
| Example 20 | 15 | — | 0.36 | 17.1 | A | 1 | 70 | ○ | 7 | 22 |
| Example 21 | 11 | 1.5 | 0.12 | 30.3 | A | 1 | 100 | ○Δ | 11 | 35 |
| Example 22 | 11 | 1.0 | 0.005 | 28.3 | A | 1 | 90 | Δ | 8 | 23 |
| Example 23 | 11 | 1.0 | 0.80 | 25.4 | A | 1 | 80 | ○ | 3 | 6 |
| Reference Example 2 | 11 | 1.0 | 0.12 | 27.8 | B | 2 | 100 | ○ | 10 | 11 |
| Comparative Example 5 | — | — | 0.12 | 2.5 | A | 1 | 130 | ○ | 3 | 5 |
| Comparative Example 6 | 11 | 1.0 | — | 36.7 | A | 1 | 130 | Δ | 3 | 5 |
| Comparative Example 7 | — | — | 0.12 | 27.8 | B | 2 | 100 | ○ | 3 | 3.5 |

What is claimed is:

1. A presensitized plate comprising, on an aluminum support, a thermosensitive layer containing an infrared ray-absorbing dye and a water-insoluble and alkali-soluble resin, of which solubility to an alkali aqueous solution increases by heating, wherein the aluminum support has a grained structure with large undulation, a grained structure with medium undulation, and a grained structure with small undulation on a surface thereof.

2. The presensitized plate according to claim 1, wherein a mean wavelength of the grained structure with small undulation is 0.01 to 0.6 μm.

3. The presensitized plate according to claim 1, wherein an aluminum plate used in the aluminum support is made of aluminum material JIS A1050, and mean crystal grain diameters of the aluminum are 2 to 200 μm in a minor axis and 50 to 1500 μm in a major axis.

4. The presensitized plate according to claim 1, wherein the thermosensitive layer is a superimposed thermosensitive layer having two or more layers.

5. The presensitized plate according to claim 1, wherein 50 wt % or more of the water-insoluble and alkali-soluble resin is a novolac resin.

* * * * *